(12) United States Patent
Kim

(10) Patent No.: US 11,239,348 B2
(45) Date of Patent: Feb. 1, 2022

(54) WAFER BONDED GAN MONOLITHIC INTEGRATED CIRCUITS AND METHODS OF MANUFACTURE OF WAFER BONDED GAN MONOLITHIC INTEGRATED CIRCUITS

(71) Applicant: Matthew H. Kim, Scottsdale, AZ (US)

(72) Inventor: Matthew H. Kim, Scottsdale, AZ (US)

( * ) Notice: Subject to any disclaimer, the term of this patent is extended or adjusted under 35 U.S.C. 154(b) by 0 days.

(21) Appl. No.: 16/212,655

(22) Filed: Dec. 6, 2018

(65) Prior Publication Data

US 2019/0115459 A1 Apr. 18, 2019

Related U.S. Application Data

(62) Division of application No. 14/504,114, filed on Oct. 1, 2014, now Pat. No. 9,666,702, and a division of
(Continued)

(51) Int. Cl.
| | |
|---|---|
| *H01L 29/737* | (2006.01) |
| *H01L 29/267* | (2006.01) |
| *H01L 29/165* | (2006.01) |
| *H01L 29/12* | (2006.01) |
| *H01L 29/08* | (2006.01) |
| *H01L 29/10* | (2006.01) |
| *H01L 29/20* | (2006.01) |
| *H01L 33/00* | (2010.01) |
| *H01L 29/66* | (2006.01) |

(Continued)

(52) U.S. Cl.
CPC ...... *H01L 29/7378* (2013.01); *H01L 29/0817* (2013.01); *H01L 29/0821* (2013.01); *H01L 29/1004* (2013.01); *H01L 29/122* (2013.01); *H01L 29/165* (2013.01); *H01L 29/2003* (2013.01); *H01L 29/267* (2013.01); *H01L 29/66242* (2013.01); *H01L 29/66318* (2013.01); *H01L 29/7371* (2013.01); *H01L 33/0004* (2013.01); *H01L 51/0024* (2013.01); *H01L 2924/13051* (2013.01); *H01S 5/0202* (2013.01); *H01S 5/0218* (2013.01); *H01S 5/06203* (2013.01); *H01S 5/3412* (2013.01); *H01S 5/3427* (2013.01)

(58) Field of Classification Search
CPC .......... H01L 29/7378; H01L 29/66242; H01L 29/7371; H01L 29/267; H01L 29/165; H01L 29/122; H01L 25/04–50; H01L 51/0024; H01L 29/737–7378; H01L 29/66318; H01L 29/0817; H01L 2924/13051

See application file for complete search history.

(56) References Cited

U.S. PATENT DOCUMENTS 8,076,699 B2 * 12/2011 Chen ................. H01L 27/0605
257/194
9,362,281 B2 * 6/2016 Bayram ............. H01L 29/0642
(Continued)

*Primary Examiner* — Bac H Au
(74) *Attorney, Agent, or Firm* — Bryan Cave Leighton Paisner LLP

(57) ABSTRACT

Wafer bonded GaN monolithic integrated circuits and methods of manufacture of wafer bonded GaN monolithic integrated circuits and their related structures for electronic and photonic integrated circuits and for multi-functional integrated circuits, are described herein. Other embodiments are also disclosed herein.

16 Claims, 28 Drawing Sheets

Related U.S. Application Data application No. 14/217,022, filed on Mar. 17, 2014, now Pat. No. 9,437,772.

(60) Provisional application No. 62/595,601, filed on Dec. 7, 2017.

(51) Int. Cl.
*H01L 51/00* (2006.01)
*H01S 5/062* (2006.01)
*H01S 5/02* (2006.01)
*H01S 5/34* (2006.01)

(56) References Cited

U.S. PATENT DOCUMENTS

| | | | | |
|---|---|---|---|---|
| 9,647,656 | B2* | 5/2017 | Masuda | H03K 17/16 |
| 9,666,677 | B1* | 5/2017 | Raring | H01L 27/0605 |
| 2005/0032323 | A1* | 2/2005 | Chen | H01L 29/42304 |
| | | | | 438/369 |
| 2006/0138460 | A1* | 6/2006 | Sasaki | H01L 29/7371 |
| | | | | 257/197 |
| 2006/0289896 | A1* | 12/2006 | Miyamoto | H01L 29/42304 |
| | | | | 257/197 |
| 2008/0296617 | A1* | 12/2008 | Mishra | H01L 29/7802 |
| | | | | 257/190 |
| 2009/0134939 | A1* | 5/2009 | Feng | H01L 29/1004 |
| | | | | 327/581 |
| 2010/0301347 | A1* | 12/2010 | Chung | H01L 21/2007 |
| | | | | 257/76 |
| 2011/0180857 | A1* | 7/2011 | Hoke | H01L 29/045 |
| | | | | 257/255 |
| 2011/0233702 | A1* | 9/2011 | Takahashi | H01L 27/14636 |
| | | | | 257/432 |
| 2012/0248544 | A1* | 10/2012 | Yokoyama | H01L 29/045 |
| | | | | 257/369 |
| 2013/0344825 | A1* | 12/2013 | Ripley | H03F 3/195 |
| | | | | 455/90.2 |
| 2015/0035121 | A1* | 2/2015 | Sasaki | H01L 23/535 |
| | | | | 257/566 |

\* cited by examiner

1300 P-type GaAs Wafer
Wafer Bonded to N-type GaN

N-type GaN Wafer 1302

P-type GaAs Wafer 1303

1301 Curve Tracer I-V
of P-type GaAs Wafer Bonded to N-type GaN

GaN HEMT 1500

InP HEMT 1510

InAlN-GaN HEMT 2400

Wafer Bonded InGaP-GaAs-GaN NPN HBT 2420

NPN InP Emitter – GaAsSb Base – GaN Collector HBT 2600

InAlN-GaN HEMT 2700

Wafer Bonded InP-GaAsSb-GaN NPN HBT 2720

Emitter-Base Stack 2830

WAFER BONDED GAN MONOLITHIC INTEGRATED CIRCUITS AND METHODS OF MANUFACTURE OF WAFER BONDED GAN MONOLITHIC INTEGRATED CIRCUITS

CROSS-REFERENCE TO RELATED APPLICATIONS

This application claims priority to U.S. Provisional Patent Application No. 62/595,601 filed Dec. 7, 2017 and U.S. Pat. No. 9,666,702B2 issued May 30, 2017 and U.S. Pat. No. 9,437,772B2 issued Sep. 6, 2016, the contents of which are hereby incorporated by reference.

BACKGROUND

Integrated circuits can be formed by various processes and are important for use as electronic and photonic devices.

BRIEF SUMMARY

This description of the advantages of the invention relates generally to semiconductor devices, and more particularly to heterogeneously and monolithically formed devices with GaN for electronic and photonic integrated circuits and for multi-functional integrated circuits. Monolithically formed GaN devices by wafer bonding GaN and semiconductor materials, are described herein.

Figure 1:
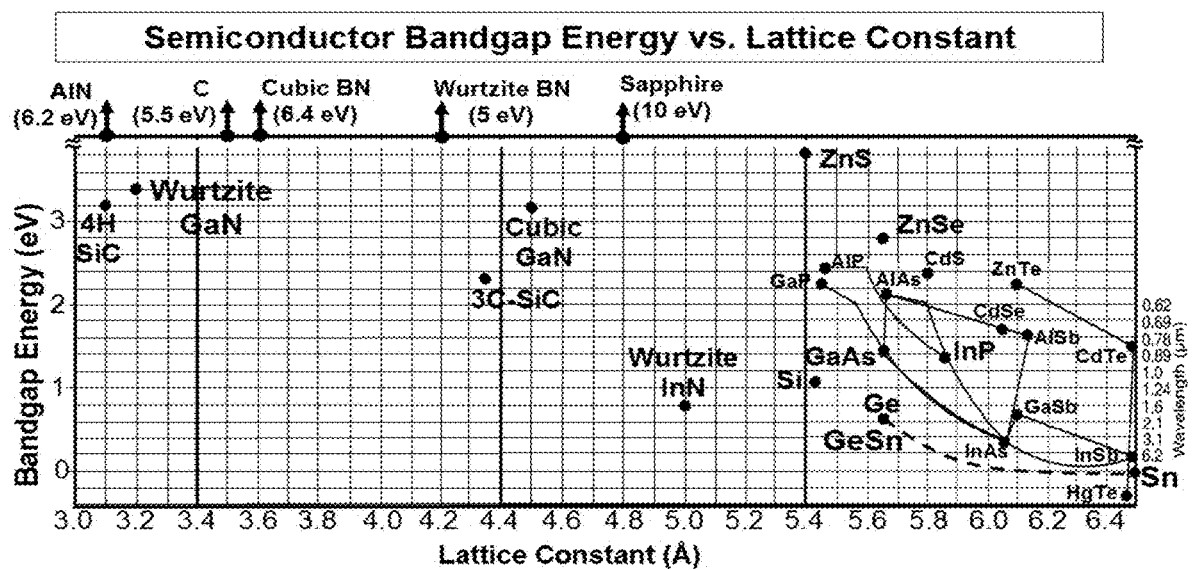
FIG. 1 shows a diagram of energy bandgaps of various semiconductors vs. their lattice constants.

For simplicity and clarity of illustration, the drawing figures illustrate the general manner of construction, and descriptions and details of well-known features and techniques may be omitted to avoid unnecessarily obscuring the present disclosure. Elements in the drawing figures are not necessarily drawn to scale. For example, the dimensions of some of the elements in the figures may be exaggerated relative to other elements to help improve understanding of embodiments of the present disclosure. The same reference numerals in different figures denote the same elements.

The terms "first," "second," "third," "fourth," and the like in the description and in the claims, if any, are used for distinguishing between similar elements and not necessarily for describing a particular hierarchical, sequential, or chronological order. It is to be understood that the terms so used are interchangeable under appropriate circumstances such that the embodiments described herein are, for example, capable of operation in sequences other than those illustrated or otherwise described herein. Furthermore, the terms "include," and "have," and any variations thereof, are intended to cover a non-exclusive inclusion, such that a process, method, system, article, device, or apparatus that comprises a list of elements is not necessarily limited to those elements, but may include other elements not expressly listed or inherent to such process, method, system, article, device, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein.

The terms "couple," "coupled," "couples," "coupling," and the like should be broadly understood and refer to connecting two or more elements or signals, electrically, mechanically or otherwise. Two or more electrical elements may be electrically coupled, but not mechanically or otherwise coupled; two or more mechanical elements may be mechanically coupled, but not electrically or otherwise coupled; two or more electrical elements may be mechanically coupled, but not electrically or otherwise coupled. Coupling (whether mechanical, electrical, or otherwise) may be for any length of time, e.g., permanent or semi-permanent or only for an instant.

"Electrical coupling" and the like should be broadly understood and include coupling involving any electrical signal, whether a power signal, a data signal, and/or other types or combinations of electrical signals. "Mechanical coupling" and the like should be broadly understood and include mechanical coupling of all types. The absence of the word "removably," "removable," and the like near the word "coupled," and the like does not mean that the coupling, etc. in question is or is not removable.

DETAILED DESCRIPTION

The fabrication of a monolithically integrated electronic circuit or photonic circuit or multi-functional integrated circuit or device on a GaN or GaN based material by wafer bonding or direct wafer bonding or monolithic wafer bonding or wafer bonding with and without intermediate is described herein. Where GaN is used as the base material to develop and manufacture by wafer bonding in electronics and photonics for an integrated circuit or multi-functional integrated circuit or device. Wafer bonding of integrated circuits may be formed by combining materials of significantly different lattice constants to form a new type of heterojunction material or circuit or device. Furthermore these materials with significantly different lattice constants can be integrated into other monolithic devices by wafer bonding. These materials can be radiation hard for military and space applications.

Embodiments described herein can relate to the following: for the material systems GaN, GaAs, AlN, Si, SiC, sapphire, diamond, AlGaN, InAlN, InGaP, InP, InN, InAs, InGaAs, Ge, GeSn, GeSiSn, and SiGe, and thus would be useful for making a heterojunction transistor material or circuit or device. Nomenclature: Ga (gallium), N (nitrogen or nitride), As (arsenic or arsenide), Si (silicon), C (carbon or carbide), In (indium), Sn (tin), Al (aluminum), B (boron), P (phosphorous), Ge (germanium), and Mg (magnesium). The embodiments can relate to the following:

The same or different embodiments can relate to:
1. Lateral structures
2. Vertical structures
3. Inverted vertical structures
4. Radiation hard
5. Integrated circuits
6. Electronic integrated circuits
7. Opto-electronic integrated circuits
8. Photonic integrated circuits
9. Heterogeneous integration of circuits FIG. 1 shows bandgap energies of various semiconductors as a function of the lattice constant. It can be readily seen that new types of semiconductor devices could be formed if the lattice matching constraints were eliminated. Semiconductors GaAs, InP, InAs, Si, InN, GeSn, and Ge lattice constants are highly mismatched to GaN which makes it nearly impossible to grow these films on GaN. It may be possible to optimize heterojunctions based on the materials characteristics instead of those constrained to near lattice constant materials. It is with this aim that manufacturing wafer bond methodologies can be used to join dissimilar materials to form fully optimized state-of-the-art electronic devices.

One possible methodology for forming new types of heterogeneously integrated circuits is to use the technique of wafer bonding. Wafer bonding may consist of the following methodology but is not limited to this following description.

The merging of the material 1 with material 2 by utilizing the wafer bonding process for fabrication of heterogeneous materials, are described herein. With this approach, the material 1 and material 2 layers can be joined to make a single composite structure. Monolithic wafer bonding may be an advanced process for forming devices like P-N junctions, transistors, photo-diodes, photo-transistors, light emitting transistors, lasers, and solar cells. This wafer bonding technique may allow the formation of a robust monolithic material 1 to material 2 for heterointerface without the requirement of lattice matching. Wafer bonding allows for the formation of a heterointerface without having to perform heteroepitaxy of two poorly latticed matched materials. The wafer bonding technique described herein allows formation of a junction that is a robust monolithic structure, where the interface may be covalently bonded or hydrophilic bonded or hydrophobic bonded or van der Waals bonded.

Figure 2:
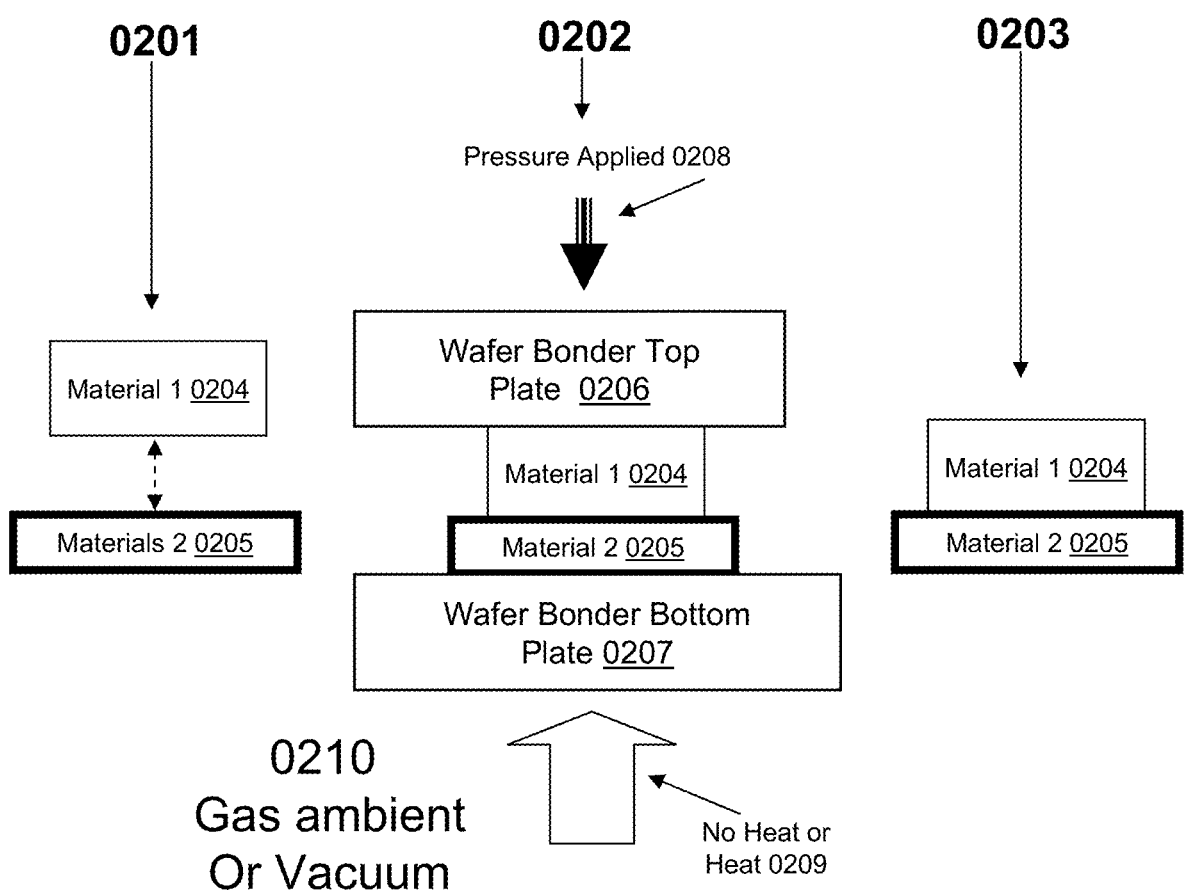
FIG. 2 shows an exemplary wafer bonding process that enables monolithic joining of two dissimilar semiconductor materials.

FIG. 2 shows the exemplary wafer bonding process that enables monolithic joining of two dissimilar semiconductor materials. The characteristics for wafer bonding may require proper surface preparation, suitable surface roughness, pressure, heat, gas ambient, vacuum and time for the formation of a monolithic composite structure. The new composite material may establish a material 1 to material 2 heterointerface. Wafer bonding allows formation of a heterointerface without having to perform heteroepitaxy of two poorly matched materials. An exemplary wafer bonding methodology may comprise step 0201 where the material 1 0204 and material 2 0205 semiconductors are cleaned in preparation for joining, step 0202 the material 1 0204 and material 2 0205 are placed on each other in between the wafer bonder top plate 0206 and wafer bonder bottom plate 0207, basically the jaws of the wafer bonder, and may be held under no heat or heat 0209 and pressure applied 0208 for the requisite time and in a gas ambient or vacuum 0210, then step 0203 the final structure is a monolithic composite material with material 1 0204 bonded to material 2 0205. Note the wafer bonded interface may have additional growth layers on the material 1 surface to be wafer bonded and material 2 surface to be wafer bonded to promote adhesion and enhance electrical properties.

Table 1 summarizes the problems with epitaxial crystal growth and shows how wafer bonding may solve these issues.

TABLE 1

Possible Advantages of Wafer Bonding

| Issues with Standard Epitaxial Technology | Advantages of Wafer Bonding Technology |
| --- | --- |
| Limited materials choices: Requires near lattice matched materials. | Lattice matching is not required. |
| High temperature growth of 450° C. to 1100° C. | Room temperature to high temperature. |
| High thermal budget. | Low thermal budget. |
| Difficult to grow on processed devices. | May be adapted to already processed devices. |
| Slow: Growth time of many hours. | Fast: Possible process time of few minutes to less than 1 hour. |
| Toxic process gases or source chemicals. | Safe ambient environment: nitrogen, argon, oxygen, and/or vacuum. |
| Equipment cost significantly high. | Equipment cost low. |
| High equipment maintenance cost. | Significantly low equipment maintenance cost. |
| Facility requires expensive cleanroom. | Laminar flow enclosure acceptable. |
| Highly experienced engineer and staff. | Technician can run the wafer bonding process. |

A detailed description for forming monolithic integrated circuits which may comprise of a GaN device with an open area for wafer bonding with Si or GaAs or InP or InAs or SiC devices to form a multi-functional integrated circuit, are described herein. In one embodiment, a high electron mobility transistor (HEMT) can include an InAlN or an AlGaN barrier region. In another embodiment, a high electron mobility transistor can include a GaN intrinsic channel region. In another embodiment, a method of manufacturing a heterojunction electron mobility transistor can include forming an InAlN or an AlGaN barrier region. These materials can be radiation hard for military and space applications. Furthermore these materials can be integrated into other monolithic devices by wafer bonding.

A high electron mobility transistor may be a three terminal device that relies on doping (adding impurity atoms) of the semiconductor layers to form N-type or N (electron surplus layer) semiconductor and P-type or P (electron deficient layer) semiconductor. Also a low doped semiconductor devoid of carriers may be referred to as an intrinsic layer (I) or may be termed UID (unintentionally doped). The superscripts $N^+$ and $P^+$ refer to high doping levels. The subscripts $N^-$ and $P^-$ refer to low doping levels. Also one can implant dopants like boron for contacts or for current blocking layers. Three terminal devices can include P-N junctions or Schottky junctions and ohmic regions.

The HEMT may also be called HFET (heterojunction field effect transistor) which is a field effect transistor (FED that may be used as a power amplifier for a transmitter module on a cellular phone. Wide bandgap semiconductors such as GaN with their large breakdown voltage and high mobility may be useful for the next generation high performance RF power transistors for applications requiring radiation hardness. Conventional AlGaN/GaN HEMTs, which are making significant impact on wireless systems, are generally depletion-mode (i.e., normally-on). The HEMT may consist of a conductive channel with two ohmic contacts.

Figure 3:
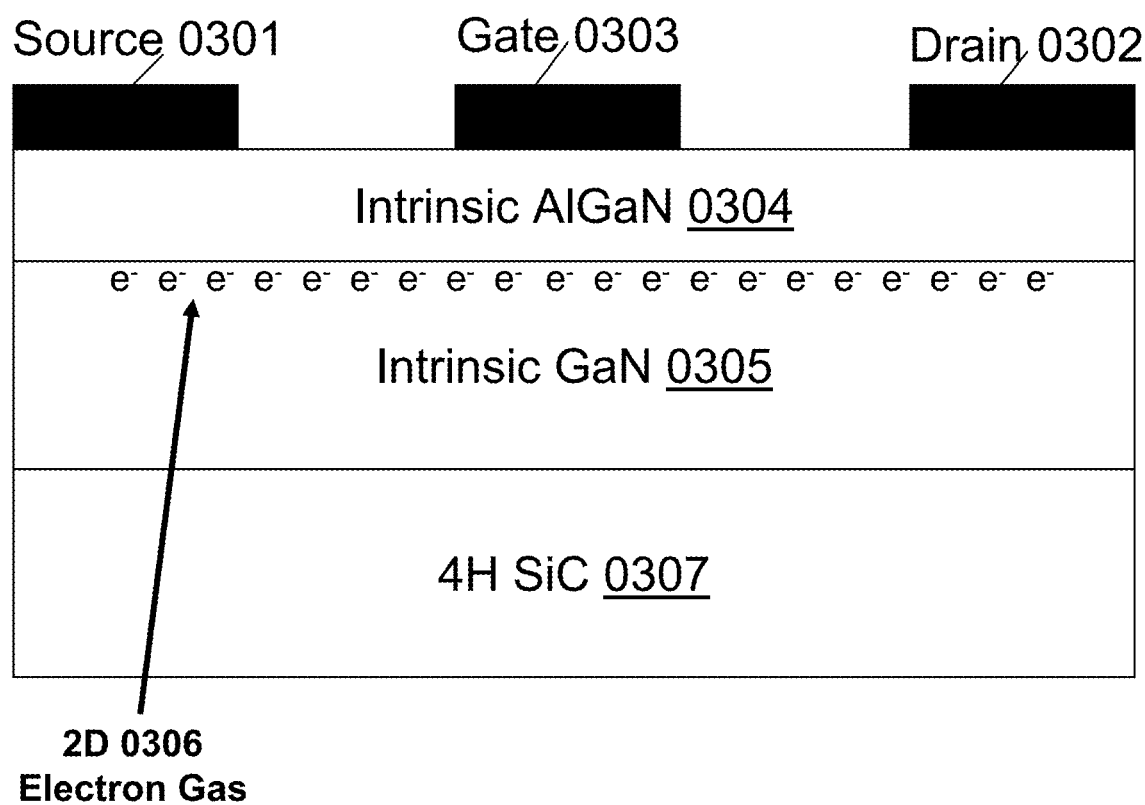
FIG. 3 shows a general cross-sectional schematic diagram of AlGaN/GaN normally-on HEMT.

FIG. 3 shows an exemplary cross-sectional diagram of a depletion mode of AlGaN/GaN normally-on HEMT, where a voltage between the drain 0302 and the source 0301 can be controlled by the gate 0303 voltage. The drain 0302 may be positively biased with respect to the source 0301. In this configuration electrons flow from the source 0301 to the drain 0302. The gate 0303 may be the third electrode that may form a rectifying contact to the channel. The positive bias on the drain may result in the depletion region which may be asymmetrically shifted toward the drain. The gate 0303 may control the current between the source 0301 to the drain 0302. The FET can be thought of as a voltage controlled resistor, where the resistance may be controlled by the depletion depth. Also geometrical considerations of the device layout may be important for performance of FET devices. The gate metal may form a Schottky barrier to the intrinsic AlGaN 0304, and the source and drain form ohmic contacts to the intrinsic AlGaN. In some instances the gate can be above a P-type layer AlGaN barrier layer forming a P-N junction with the intrinsic GaN 0305 region. In heterostructure III-nitrides, due to the lack of inversion symmetry in the crystal, polarization fields may arise spontaneously and may be an important feature for these materials. Due to these polarization fields, a large number of electrons can accumulate at the interface of nitride heterostructures without the chemical doping that is required in GaAs or other conventional semiconductor-based heterostructures. The high electric field at the interface from the polarization confines the electrons two dimensionally, thus forming a two dimensional 2D 0306 electron gas or 2D sheet charge. The 2D 0306 electron gas may result in a high mobility because the electron transport properties may not be affected by Coulomb scattering, by separating the free electrons from their donor impurities. The gate forms a Schottky barrier to the intrinsic AlGaN barrier and the source and drain form ohmic contacts to the intrinsic AlGaN barrier. The intrinsic GaN 0305 may be grown on a 4H SiC 0307 or on SiC Polymorph substrates or on a Si substrate or on a GaN substrate or on Sapphire substrate or on a GaAs substrate or on a Diamond substrate.

To determine suitability of grown material a characterization scheme is necessary to qualify the wafer. When sufficient success has been achieved in obtaining good materials parameters, a DC qualification procedure may be implemented to further tighten materials specifications. For the power amplifier application the major DC parameters may be the drain to source saturation current $I_{DSS}$, threshold voltage $V_{th}$, transconductances $g_m$, breakdown voltage of the gate to drain $V_{BR}$ or sometimes called $BV_{GD}$ and on resistance $R_{on}$ of the device. The threshold voltage $V_{th}$ may be the point where the device is considered off. Good threshold uniformity and repeatability may be necessary for good controllability of the device. For HEMT the $V_{th}$ may be proportional to the sheet density $N_{sheet}$ in the channel times the gate to channel depth d: $V_{th} \propto N_{sheet} \times d$. It may be important to control the top AlGaN or InAlN barrier thickness carefully to ensure the proper $V_{th}$ is a useful parameter for mapping out dopant and thickness uniformity of the layer.

For FETs, $g_m$ can be considered to be the effective gain of the device. It may be the slope of $I_{DS}$ vs. $V_{GS}$: $g_m = \Delta I_{DS}/\Delta V_{GS}$. For HEMTs, the $g_m$ may have a characteristic hump, due to the narrowness of the charge distribution. Sometimes the circuitry may be adjusted to optimize the operation of the device. The typical definition of the threshold voltage can be determined from this characteristic. If the square root of $I_{DS}$ is plotted as a function of $V_{GS}$, and a line is fitted to the linear region, then the intercept at zero current may be defined as the threshold voltage.

Semiconductors can be discussed in terms of their energy band structure. The energy band structure shows the allowable carrier (electron or hole) energy states for semiconductor as a function of the crystal momentum direction. The energy band structure can be divided into two main regions: the conduction band; and the valence band. N-type material conduction relies on free movement of electrons in the conduction band of the material. The conduction band can be characterized by the conduction band energy level (lowest energy in the conduction band). P-type material conduction relies on the free movement of holes (hole: absence of an electron) in the valence band of the material. The valence band is characterized by the valence band energy level (or the highest energy level in the valence band). The difference between the conduction band energy level and the valence band energy level determines the energy bandgap of the semiconductor (difference of the conduction band energy minima to the valence band energy maxima).

At the P-N junctions or Schottky junctions, there exists a depletion zone that in the absence of an externally applied electric field prevents the movement of the charge carriers across the junctions or different layers. The operation of this device relies on two types of carriers, free electrons (negative charges in the conduction band) and free holes (absent electron charge carrier, positive charge in the valence band). Thus, the name P-N junction is ascribed because its operation involves both electrons and holes, as opposed to Schottky junction whose operation involves only one of electrons or holes. The gate may consist of P-N junctions or Schottky junctions.

Figure 4:
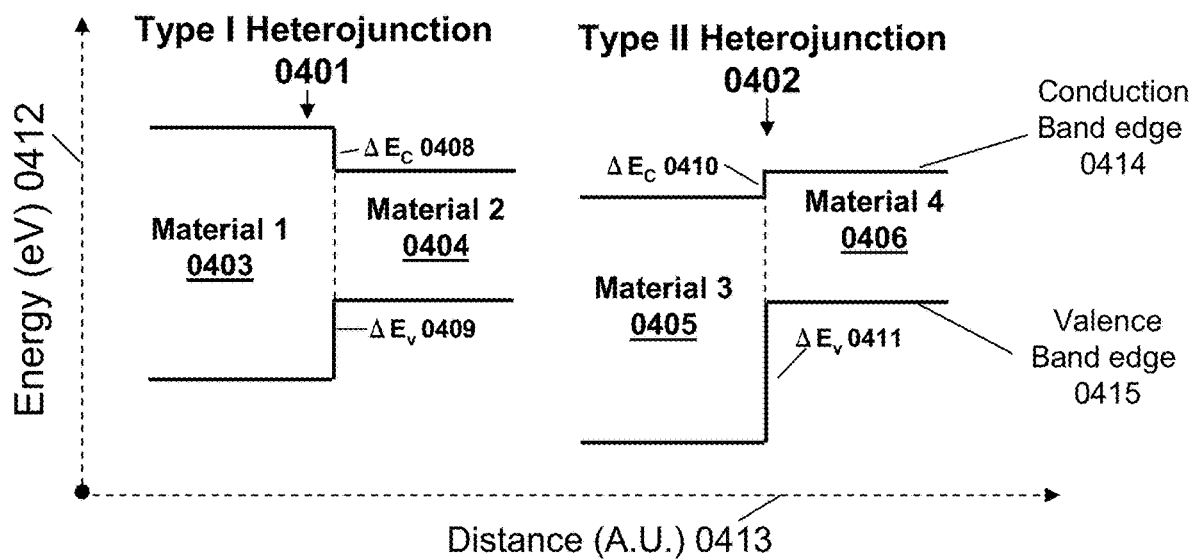
FIG. 4 shows a flat band energy diagram for typical heterojunction type I and type II situations between the material 1 and material 2.

FIG. 4 shows the two typical types of heterojunctions. The type of diagram depicted is called a flat band edge energy diagram. The energy levels, one called the conduction band edge represents the minimum energy value of the conduction band. The other called valence band edge represents the maximum value of the valence band. The diagram shows distance on the horizontal scale and that is distance into the semiconductor device, where (A.U.) represents arbitrary units. One could put units of thickness but that is usually omitted and this represents a schematic for carrier transport.

There are various types of heterojunctions between materials, as shown in FIG. 4: (1) Type I heterojunction 0401; and (2) Type II heterojunction 0402. Also a type III broken conduction or valence band as a third type of heterojunction. There can also be a near-zero valence band offset or zero conduction band offset at the heterojunction. Type I heterojunction has an energy discontinuity at the conduction band and valence band, where the smaller bandgap material 2 0404 regions lies between the conduction and valence band edges of the larger bandgap material 1 0403. $\Delta E_C$ 0408 is called the conduction band offset at the material 1 0403-material 2 0404 heterojunction (difference between the conduction band edges in the respective materials), and $\Delta E_V$ 0409 is called the valence band offset at the material 1 0403-material 2 0404 heterojunction (difference between the valence band edges in the respective materials). Type II heterojunctions have a discontinuity at the conduction and valence band edge, but the base energy alignment is staggered or offset. The energy bandgap of material 4 0406 can be staggered above the bandgap of material 3 0405 as depicted in FIG. 4 (or alternatively may be staggered below the bandgap). $\Delta E_C$ 0410 is called the conduction band offset at the material 3 0405-material 4 0406 heterojunction (difference between the conduction band edges in the respective materials), and $\Delta E_V$ 0411 is called the valence band offset at the material 3 0405-material 4 0406 heterojunction (difference between the valence band edges in the respective materials). The vertical axis is the Energy (eV) 0412 and the horizontal axis is the Distance (A.U.) 0413. Also the conduction band edge 0414 and valence band edge 0415 are depicted.

The development of a normally-off GaN HEMT device, may be preferred for power systems to ensure fail-safe operation and RF power electronics. Normally-off GaN transistors for DC-DC converters may be utilized for power electronic applications such as high-power switching for highly efficient power switches in grid-tied energy storage and conversion or switched power-supplies or AC motor-drive systems.

Normally-off InAlN—GaN HEMTs on different SiC Polymorphs or GaN or Si or Sapphire or Diamond or GaAs substrates may be useful for the development of robust power switching devices for the efficient transfer of power from one stage to another in DC-DC conversion applications. The GaN/InAlN/GaN normally-off HEMT may project a lower on-state resistance and higher current drive than more conventional devices, leading to higher power converter efficiency and performance.

Figure 5:
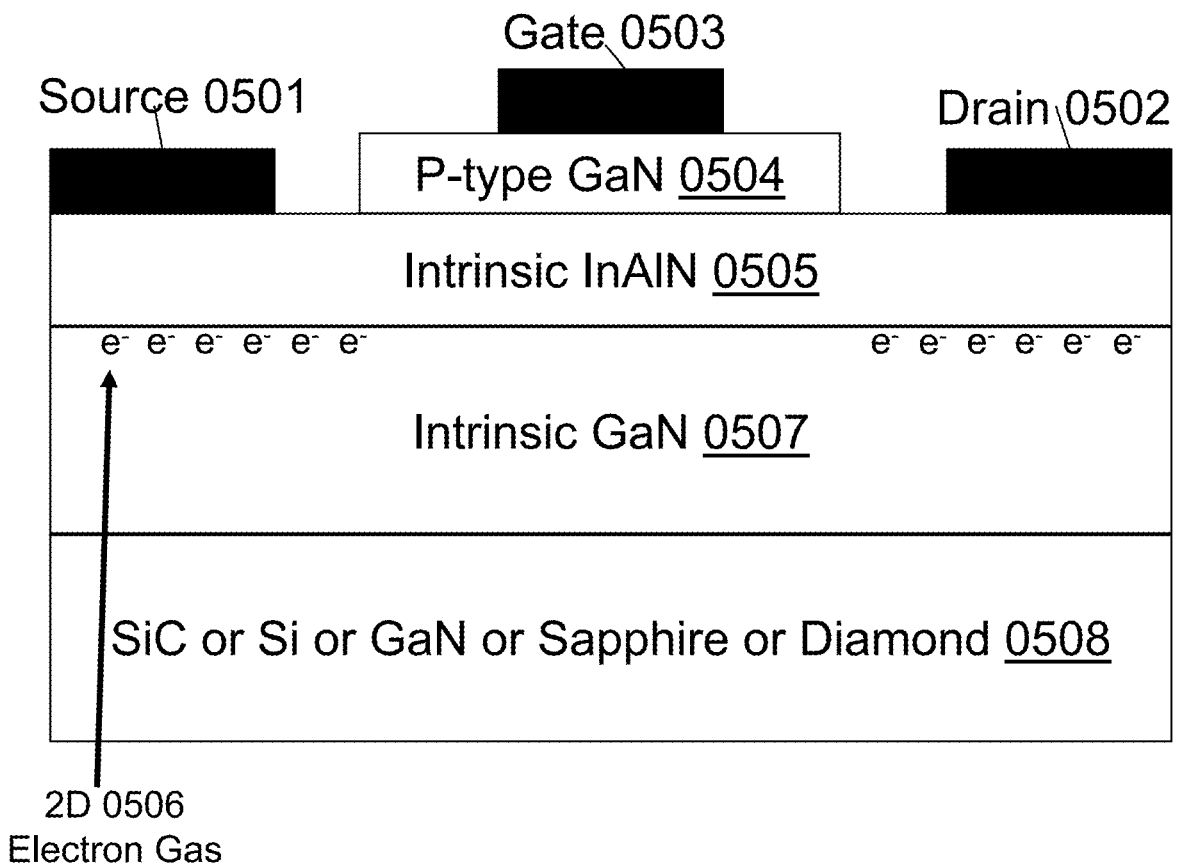
FIG. 5 shows a possible embodiment of a normally-off GaN HEMT, with an AlGaN barrier layer.

FIG. 5 shows a cross-sectional schematic of an exemplary normally-off or enhancement mode GaN/InAlN/GaN HEMT. This structure may have the added advantage that InAlN may be latticed matched to GaN, thus eliminating piezoelectric effects that have been speculated to be a reliability issue in GaN electronics. The gate 0503 may be on top of a P-type GaN 0504 (also may be P-type AlGaN or P-type InAlN) which forms a P-N junction to the intrinsic InAlN 0505, and the source 0501 and drain 0502 forms ohmic contacts to the intrinsic InAlN. In this configuration electrons flow from the source 0501 to the drain 0502. The gate 0503 may be the third electrode that may form a rectifying contact to the channel. The positive bias on the drain may result in the depletion region which may be asymmetrically shifted toward the drain. The gate 0503 may control the current between the source 0501 to the drain 0502. Initially the gate region may be deposited on P-type GaN 0504 which may fully deplete the InAlN 0505, thus the device may operate in normally-off or in enhancement mode. This normally-off GaN HEMT may be fully depleted for small gate to source voltages, due to the P-type GaN 0504 forming a depletion region through the 2D electron gas 0506 or 2D sheet charge at the intrinsic InAlN 0505-intrinsic GaN 0507 heterointerface. Also geometrical considerations of the device layout may be important for performance of FET devices. The gate 0503 metal may be on the P-type GaN 0504 and the source 0501 metal and drain 0502 metal may form ohmic contacts to the intrinsic InAlN 0505. In heterostructure III-nitrides, due to the lack of inversion symmetry in the crystal, polarization fields may arise spontaneously and may be an important feature for these materials. Due to these polarization fields, a large number of electrons can accumulate at the interface of nitride heterostructures without the chemical doping that is required in GaAs or other conventional semiconductor-based heterostructures. The high electric field at the heterointerface between the InAlN 0505 and the intrinsic GaN 0507 from the polarization confines the electrons two dimensionally thus forming a two dimensional 2D 0506 electron gas or 2D sheet charge. The 2D 0506 electron gas may result in a high mobility (the electron transport properties are not affected by Coulomb scattering) by separating the free electrons from their donor impurities. The intrinsic GaN 0507 may be grown on a 4H SiC or Si or GaN or Sapphire or Diamond 0508 or SiC Polymorph substrates or GaAs substrate.

InAlN at near or approximately the composition of 17.6% Indium (In) may be latticed matched to GaN, where there may be no resultant piezoelectric component to the polarization charge, it may be entirely spontaneous, and the polarization discontinuity at the InAlN/GaN interface may be significantly larger than what is typically obtained at AlGaN/GaN interfaces. Note that this may not be the only composition of InAlN that can be used, and different compositions may be introduced to produce tensile or compressive strain like (In 5% to 30%).

Figure 6:
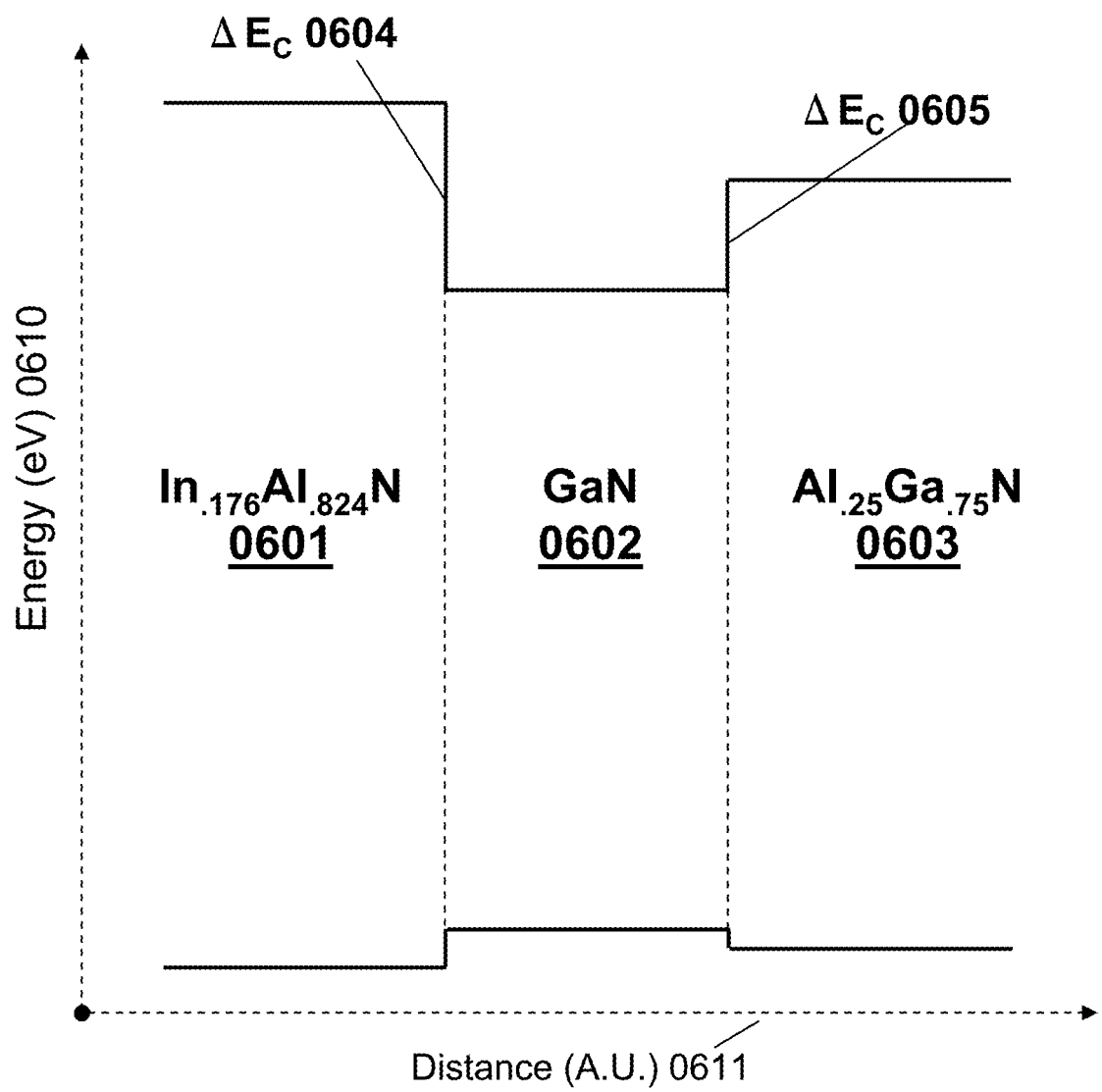
FIG. 6 shows a possible band alignment diagram where the conduction band discontinuity between InAlN—GaN may be sizable at approximately 1 eV, whereas the conduction band discontinuity between AlGaN—GaN may be smaller at approximately 0.6 eV.

FIG. 6 shows a typical energy band alignments (flat band), where the vertical axis is Energy (eV) 0610 and the horizontal is the Distance (A.U.) 0611, between $In_{0.176}Al_{0.824}N$ 0601 which may have a bandgap energy near 4.6 eV and GaN 0602 which may have a bandgap energy of 3.4 eV, where there may be a sizable approximately $\Delta E_C$ 0604 of 1 eV conduction band discontinuity formed at the heterointerface. For a possible $Al_{0.25}Ga_{0.75}N$ 0603 which may have a composition near Al %=25%, the bandgap energy may be about 4.1 eV, which may result in a conduction band offset $\Delta E_C$ 0605 of approximately 0.6 eV with GaN 0602. Note that this may not be the only composition of AlGaN 0603 that can be used, and different compositions may be introduced to produce tensile or compressive strain like (Al 0% to 40%). The much larger conduction band offset for the InAlN 0601-GaN 0602 heterointerface may enable confinement of higher sheet carriers densities at the heterointerface. The large spontaneous polarization at InAlN/GaN interfaces, may result in the potential for higher current capacity in HEMT devices based on this material system.

Lattice matched InAlN on GaN may provide a heterojunction device with significantly large spontaneous polarization, and without any strain in the material. Typically InAlN/GaN heterostructures may be able to achieve a 2D electron gas or 2D sheet charge greater than $2 \times 10^{13}$ cm$^{-2}$, without strain. The absence of misfit dislocations at the heterointerface may result in lower on-resistance of the device with higher transconductance and current density, and the higher sheet charge density of the InAlN/GaN heterostructure relative to more commonly seen in AlGaN/GaN structures. Note one can also grow the InAlN in tensile or in compression to change the band alignments but to also modify the amount of sheet charge. Also it may be useful to etch away the intrinsic InAlN 0505 layer above the intrinsic GaN 0507, then the GaN 0507 could be used as a template substrate for other materials as depicted in FIG. 5.

It may be possible to estimate the maximum carrier sheet density that can be induced at the heterointerface taking into account the piezoelectric and spontaneous polarization charge. The value of the sheet charge at the $Al_{0.25}Ga_{0.75}N$/GaN interface with polarization and piezoelectric effects may be $1.67 \times 10^{13}$ cm$^{-2}$ and the $In_{0.176}Al_{0.824}N$/GaN interface induced by the polarization effects may be about $3.3 \times 10^{13}$ cm$^{-2}$. Table 2 shows a comparison of the max sheet charge density that can be achieved at the heterointerface of the two GaN heterojunctions of interest.

TABLE 2

Possible Estimated Sheet Charge for GaN Based Heterojunctions

| Structure | Sheet Charge |
| --- | --- |
| AlGaN—GaN spontaneous polarization and piezoelectric charge | $1.67 \times 10^{13}$ cm$^{-2}$ |
| InAlN—GaN spontaneous polarization charge | $3.3 \times 10^{13}$ cm$^{-2}$ |

Figure 7:
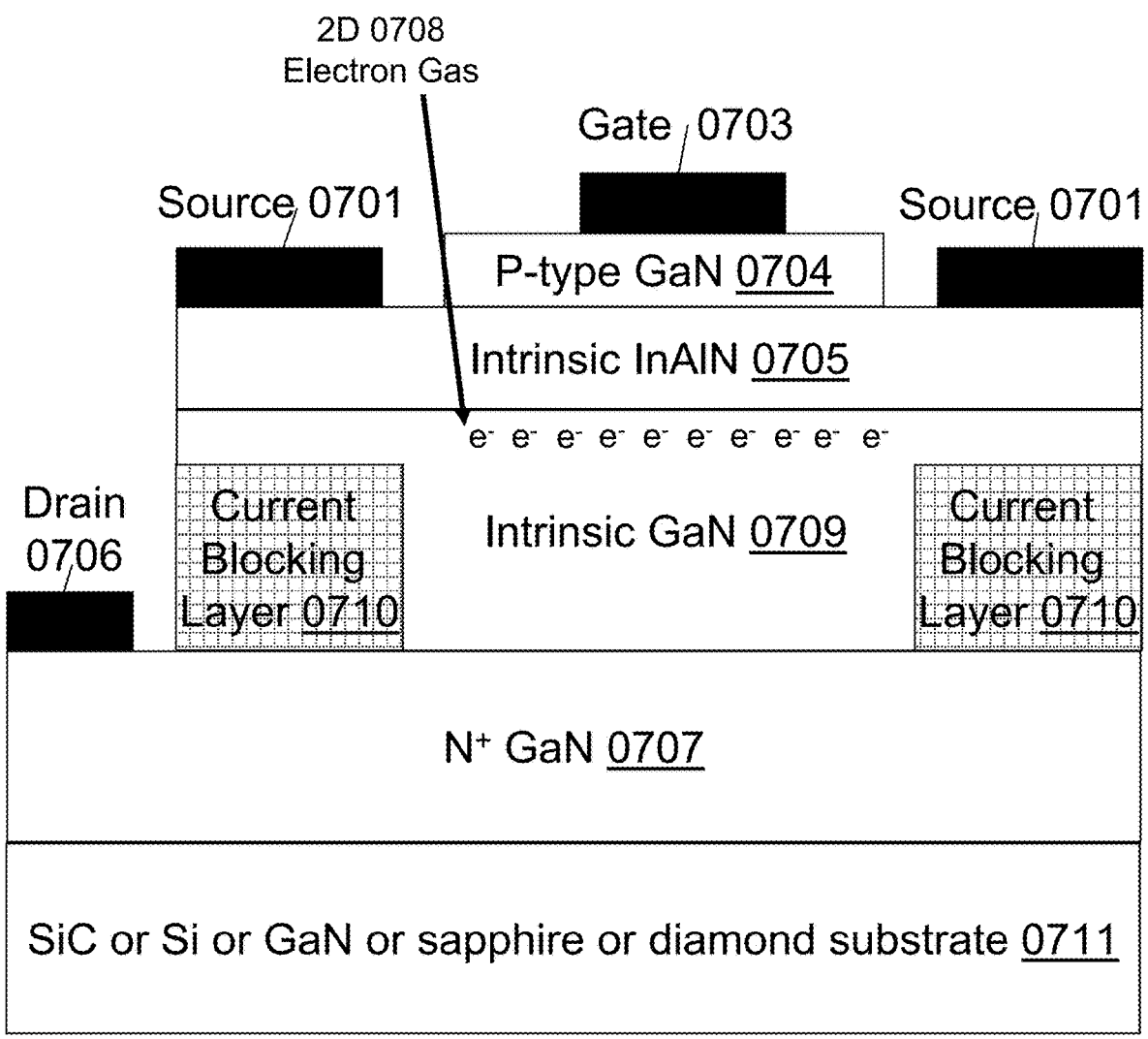
FIG. 7 shows a possible embodiment of an InAlN—GaN HEMT in a vertical geometry. Note the substrate can be SiC or GaN or Si or Sapphire or Diamond.

Another possible exemplary configuration that may be useful is to have the InAlN—GaN HEMT in a vertical configuration, which can be used for high power applications. This structure can be also used for a template substrate for other types of Si or GaAs or InP devices and other types as well. FIG. 7 shows a possible exemplary diagram of the structure. The gate 0703 metal on top of the P-type GaN 0704 (may be also P-type AlGaN) forms a P-N junction to the intrinsic InAlN 0705, and the source 0701 metal form ohmic contacts to the intrinsic InAlN 0705, and the drain 0706 metal forms an ohmic contact to the N$^+$ GaN 0707. A 2D 0708 electron gas forms at the intrinsic InAlN 0705 and the intrinsic GaN 0709. There are current blocking layer 0710 which may be boron implants or other P-type dopants or implants that disorder the lattice and make it high resistivity. The current blocking layer 0710 may confine the current in a vertical direction. The structure can be grown on SiC or Si or GaN or sapphire or diamond substrate 0711. If the SiC or Si or GaN or sapphire or diamond is conducting, the drain 0706 can be contacted to the bottom of the substrate for a full vertical device.

The device may be fabricated on SiC Polymorphs or GaN or Si or Sapphire or Diamond or GaAs substrates. While Si provides a low-cost platform for mass production of devices, SiC offers significant technical advantages due to its high thermal conductivity, an important property for high-performance power devices. In addition, growth of GaN on SiC is an extremely mature technology that is widely available commercially. This makes it the best choice for high power operation. The InAlN/GaN normally-off HEMT device may be promising for high voltage, high frequency and high temperature operation due to its wide bandgap channel and barrier, high critical field, large conduction band offset, and high channel carrier concentration from the spontaneous polarization of the InAlN/GaN heterostructure. Also this device structure may be lattice matched which may improve reliability.

Figure 8:
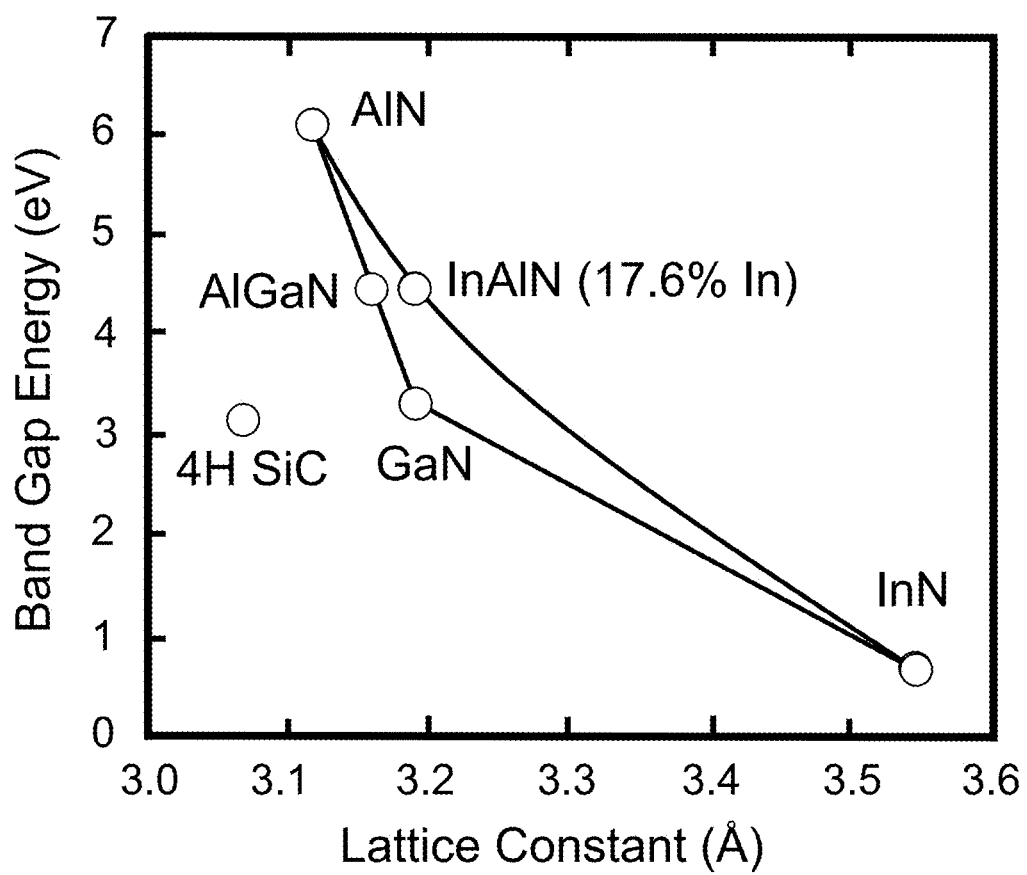
FIG. 8 shows a diagram of semiconductor lattice constants and indium composition of InAlN vs. bandgap energy for relevant semiconductors AlN, GaN and InN. AlN and GaN 4H (or 6H) SiC (or other substrates such as GaN or Si or Sapphire or Diamond) may be a useful substrate for the fabrication of the GaN HEMT.

The design of the normally-off GaN HEMT may utilize the following materials but not limited to only these materials as shown in FIG. 8. FIG. 8 shows the bandgap energy (eV) vs. the lattice constant (A) for some exemplary semiconductors AlN, GaN, InN and 4H SiC and there relationship to InAlN. It can be seen that growing wurtzite GaN material on SiC may result in about 3% lattice mismatch as compared to growing on sapphire with a lattice mismatch of 14%. Also the excellent thermal conductivity of the SiC may make it a suitable substrate (different polymorphs 4H, 6H, etc.). Other possible substrates such as GaN or Si or Sapphire or Diamond or GaAs may be useful for high power applications.

The InAlN (17.6% In) may be lattice matched to GaN, thus there is no piezoelectric field and significantly large spontaneous polarization can occur in InAlN/GaN HEMT. The 2D electron sheet density in such a structure can exceed $2\times10^{13}$ cm$^{-2}$, thus achieving significantly low channel sheet resistances (<200 Ohm/sq), and high transconductance with high current density. Note that this is not the only composition of InAlN that can be used, and different compositions may be introduced to produce tensile or compressive strain like (In 5% to 30%).

The basic device structure of an exemplary InAlN/GaN normally-off HEMT is shown in Table 3.

TABLE 3

Possible Embodiment of Epitaxial Structure of normally-off InAlN—GaN HEMT

| Layer | Layer Name | Description | Comment |
|---|---|---|---|
| 1 | P-type | 70 Å GaN P-doped = 5 × 10$^{19}$ cm$^{-3}$ | May be Mg p-doping. Thickness can be varied from 5 Å to 500 Å. Also can use p-doped AlGaN. |
| 2 | UID | 55 Å InAlN | Approximately 17.6% In content, but the composition changes can be introduced for different levels of tensile or compressive strain. (In can be from 5% to 30%). Thickness can be from 5 Å to 500 Å. |
| 3 | UID | 5,000 Å GaN | Thickness can be from 200 Å to 20,000 Å. |
| 4 | UID | 200 Å nucleation buffer | May be AlN. Thickness may be variable. |
| 5 |  | 4 H SiC substrate | Can use different SiC Polymorphs or GaN or Si or Sapphire or Diamond substrates. |

UID Unintentionally doped or Intrinsic.
Note:
the structure, materials, compositions, thicknesses, dopants, and doping levels are exemplary and does not preclude other possible structures, materials, compositions, combinations or values.

A possible embodiment for fabrication of InAlN—GaN HEMTs:
1. Ohmic contact recess etching (to remove the P-type GaN and partially recess into the UID wide bandgap InAlN barrier).
2. Ohmic contact deposition. An alloyed Ti/Al/Mo/Au ohmic contact metallization (by electron beam evaporation), self-aligned to the ohmic-contact recesses defined in step (1), followed by rapid thermal annealing, may be used. When combined with the recess etching above, this can achieve a contact resistance below 0.5 Ω-mm.
3. Device isolation. For quick-turn devices, mesa isolation by Cl-based ICP-RIE may be performed. However ion implantation may be used, and this has been shown to result in lower off-state leakage in the devices due to reduced surface leakage components.
4. Gate definition and deposition. Definition (by optical lithography) of the gate electrode, followed by deposition of a Ni/Au/Ni gate by electron-beam evaporation.
5. Channel-area recess. Removal of the p-GaN in the source and drain access regions may be performed by ICP-RIE (as in step (1), the formation of ohmic contacts by recess etching, stopping at the p-GaN/UID InAlN interface) to increase the sheet concentration in the access regions (and thus reduce series resistance). Use of optical emission spectroscopy (through detection of the Mg peak that may be present while etching Mg-doped p-GaN but absent when etching undoped InAlN, and the In peak that may be absent in the GaN but present in the underlying InAlN) may be used to aid in end-point detection.
6. Passivation of the devices using LPCVD or PECVD-based SiNx.
7. Definition and deposition of field plate metallization using conventional evaporation and lift-off.
8. For multiple-stage field plate designs, additional PECVD-based SiNx layers may be used in conjunction with metallization. The use of lateral field plates (source-connected) may also be incorporated into the device design as shown above to improve the lateral electric field distribution in the device and increase breakdown voltage.

Figure 9:
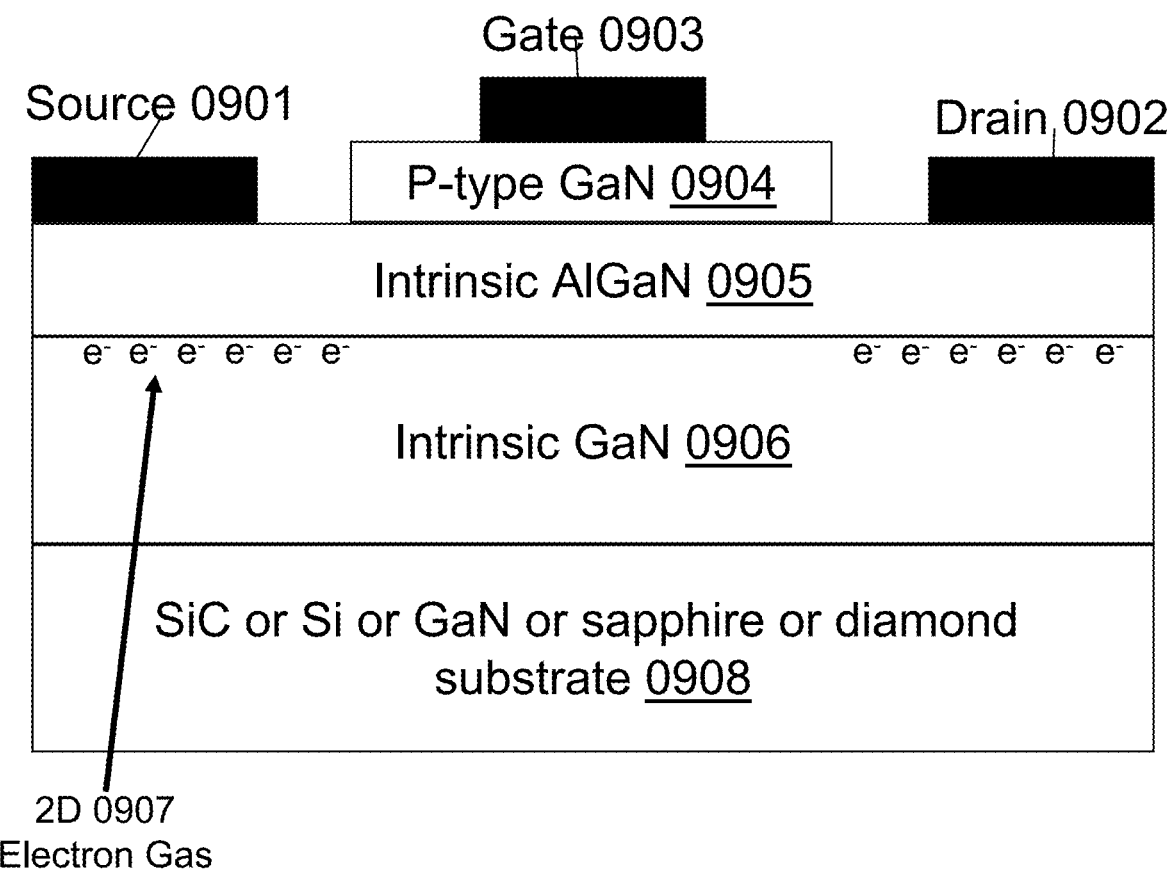
FIG. 9 shows an exemplary schematic diagram of a normally-off GaN HEMT which may be fully depleted, and the P-type AlGaN forms a depletion region through the 2D electron gas at the intrinsic AlGaN-intrinsic GaN heterointerface.

An AlGaN/GaN HEMT may also be incorporated as an enhancement mode or normally-off device. Also this device can be fabricated on SiC or GaN or Si or GaAs or Sapphire or Diamond substrates. FIG. 9 shows a possible exemplary configuration of the normally-off AlGaN/GaN HEMT. The use of a top P-type GaN 0904 layer is used to shift the threshold voltage. The gate 0903 is on top of the P-N junction forming the P-type GaN 0904 (may be also P-type AlGaN) to the intrinsic AlGaN 0905 barrier on top of the Intrinsic GaN 0906 channel, and the source 0901 and drain 0902 metal form ohmic contacts to the intrinsic AlGaN barrier. A two dimensional 2D 0907 electron gas forms at the intrinsic AlGaN 0905 and intrinsic GaN 0906 heterointerface. The structure can be grown on a SiC or Si or GaN or sapphire or diamond substrate 0908 or GaAs substrate.

Table 4 shows an exemplary enhancement-mode GaN/AlGaN/GaN HEMT. In heterostructure III-nitrides, polarization fields arise spontaneously and are important feature for these materials. Due to these polarization fields, a large number of electrons can be created at the interface of nitride heterostructure without the chemical doping that is required in GaAs—, Si— or other conventional semiconductor-based heterostructures. The high electric field at the interface confines the electrons two dimensionally, thus forming a two dimensional 2D gas or 2D sheet charge. The 2D electron gas (2DEG) results in a high mobility (the electron transport properties are not affected by Coulomb scattering). The amount of sheet charge that can occur at the AlGaN-GaN interface results in a 2D sheet density that can easily exceed $1 \times 10^{13}$ cm$^{-2}$. It is worth noting that this charge density is approximately 10 times what can be obtained with other semiconductor systems, and leads directly to a substantial advantage in on-current density and on resistance.

TABLE 4

Possible Embodiment of Epitaxial Structure of normally-off AlGaN—GaN HEMT

| Layer | Layer Name | Description | Comment |
|---|---|---|---|
| 1 | P-type | 45 Å GaN p-doped =5 × 10$^{19}$ cm$^{-3}$ | May be Mg p-doping. Thickness can be varied from 5 Å to 500 A. Also can use p-doped AlGaN. |
| 2 | UID | 70 Å AlGaN | Approximately 25% Al content, but the composition changes can be introduced for different levels of tensile or compressive strain. (Al can be from 0% to 40%). Thickness can be from 5 Å to 500 Å. |
| 3 | UID | 5,000 Å GaN | Thickness can be from 200 Å to 20,000 Å. |
| 4 | UID | 200 Å nucleation buffer | May be AlN. Thickness is variable. |
| 5 | | 4 H SiC substrate | Can use different SiC Polymorphs or GaN or Si or Sapphire or Diamond substrates. |

UID Unintentionally doped or Intrinsic.
Note:
the structure, materials, compositions, thicknesses, dopants, and doping levels are exemplary and does not preclude other possible structures, materials, compositions, combinations or values.

The following embodiments demonstrate various ways to use a GaN template on SiC or GaN or Si or Sapphire or Diamond or GaAs substrates. Each one of these materials has a unique advantage, and where the term substrate is used any one of these materials constitutes a different combination. The embodiments look at lateral devices as well as vertical devices.

This embodiment represents a possible way of integrating an InP HEMT to the normally-on GaN HEMT (normally-off could also be used) using the GaN HEMT as a template substrate providing for mechanical and thermal advantage.

Monolithically integrated microelectronic devices constructed with dissimilar semiconductor materials on the same substrates may reduce parts count. It may be possible to form monolithic integrated circuits that can lead to construction of low noise/high speed circuits based on InGaAs (InGaAs/InAlAs on InP) high electron mobility transistor (HEMT) technology that is monolithically integrated with power amplifiers based on GaN HEMT technology on the same substrates. This integrated circuit technology may utilize high quality transistor materials that are available.

Device technology based on GaN with its high electric field strength is a new direction for high-power RF amplification. GaN based materials have a large bandgap and high electron saturation velocity. Present-day GaN transistors address the traditional power electronics applications that require extraordinarily high power densities. InGaAs-channel HEMT technologies can be grown lattice matched or pseudomorphic on InP substrates, and may be useful for low noise/high frequency applications. It can be possible to combine—in one monolithic transistor embodiment—the high power capabilities of GaN HEMTs with the low noise operation of InGaAs HEMTs. Monolithically integrated InGaAs—GaN HEMT transceiver MMIC platform can enable co-integration of GaN HEMTs for the RF power amplifier and transmitter with InGaAs-channel HEMTs for the low-noise receiver by wafer bonding. GaN materials may be radiation hard and InGaAs/InAlAs HEMTs may also be radiation hard.

Figure 10:
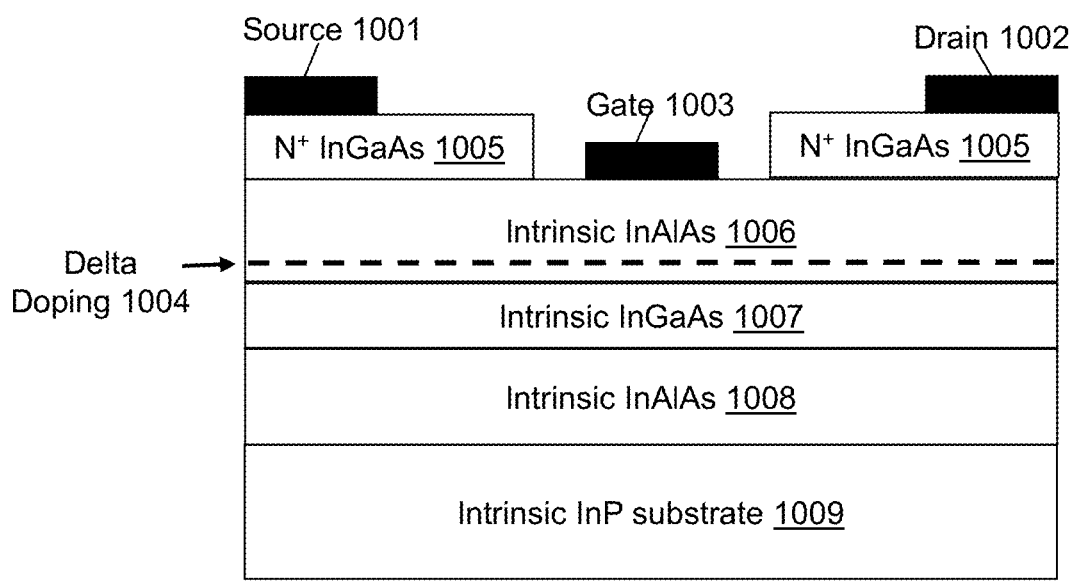
FIG. 10 shows an exemplary depiction of the cross-sectional schematic diagram of InGaAs/InAlAs/InP normally-on HEMT.

A radiation hard InGaAs/InP HEMT for low noise amplifier operation may have excellent low noise and high frequency response when operating in the W-band (millimeter wave). The ternary materials $In_{0.52}Al_{0.48}As$ and $In_{0.53}Ga_{0.47}As$ are latticed matched to InP substrates, thus resulting in low misfit dislocation density. The InGaAs/InAlAs/InP HEMT technology may be used for ultra-low noise microwave amplification FIG. 10 shows an exemplary cross-sectional schematic diagram of InGaAs/InAlAs/InP normally-on HEMT. The delta doping 1004 layer allow the formation of a 2D electron gas at the InAlAs 1006-InGaAs 1007 heterointerface, this HEMT structure can increase the mobility without decreasing the sheet carrier concentration of the device. The epitaxial structure starting with the InP substrate 1009, may have an InAlAs 1008 buffer, an InGaAs 1007 channel, an InAlAs 1006 spacer/barrier (separates delta doped layer from the channel), delta doping 1004, InAlAs 1006 barrier, and an InGaAs 1005 conducting contact layer. The source 1001 makes ohmic contact to the InGaAs 1005 layer and the drain 1002 makes contact to the N$^+$ InGaAs 1005 layer. The gate 1003 makes contact to the InAlAs 1006 barrier. The lattice matched InAlAs 1008 buffer to the InP substrate 1009 eliminates misfit dislocation which can hurt the crystallinity of the device. The spacer layer thickness and composition may be critical (determines the gate Schottky, transconductance, threshold voltage and resistance between channel and the contact layer).

An InP HEMT structure may be wafer bonded to a GaN device structure grown on SiC or GaN or Si or Sapphire or Diamond. GaN and InP-based materials have not only widely differing lattice constants but also fundamentally different crystal structures, and heteroepitaxial approaches to monolithic integration of these materials are extremely challenging. With the wafer bonding approach, the InP and GaN epitaxial layers can be joined to make a single composite robust monolithic structure, where the interface is covalently bonded. Note that Si, GaAs and other types of devices may be wafer bonded to the GaN device structure. The surface to be bonded to may be modified to promote adhesion, mechanical strength, and enhance electrical performance. Possible methods include growing additional materials on the GaN like a thin InGaN layer or a thin AlGaN layer or a thin InAlN layer or InN or other type of materials that enhance the wafer bonding process. These can be grown at numerous different In or Al compositions. Note the GaN collector template substrate could have a layer to electrically enhance performance, which can be deposited by any other epitaxial process. The seed layer could be used for adhesion or modifying the electrical interface properties of the heterojunction to improve performance or reliability.

Figure 11:
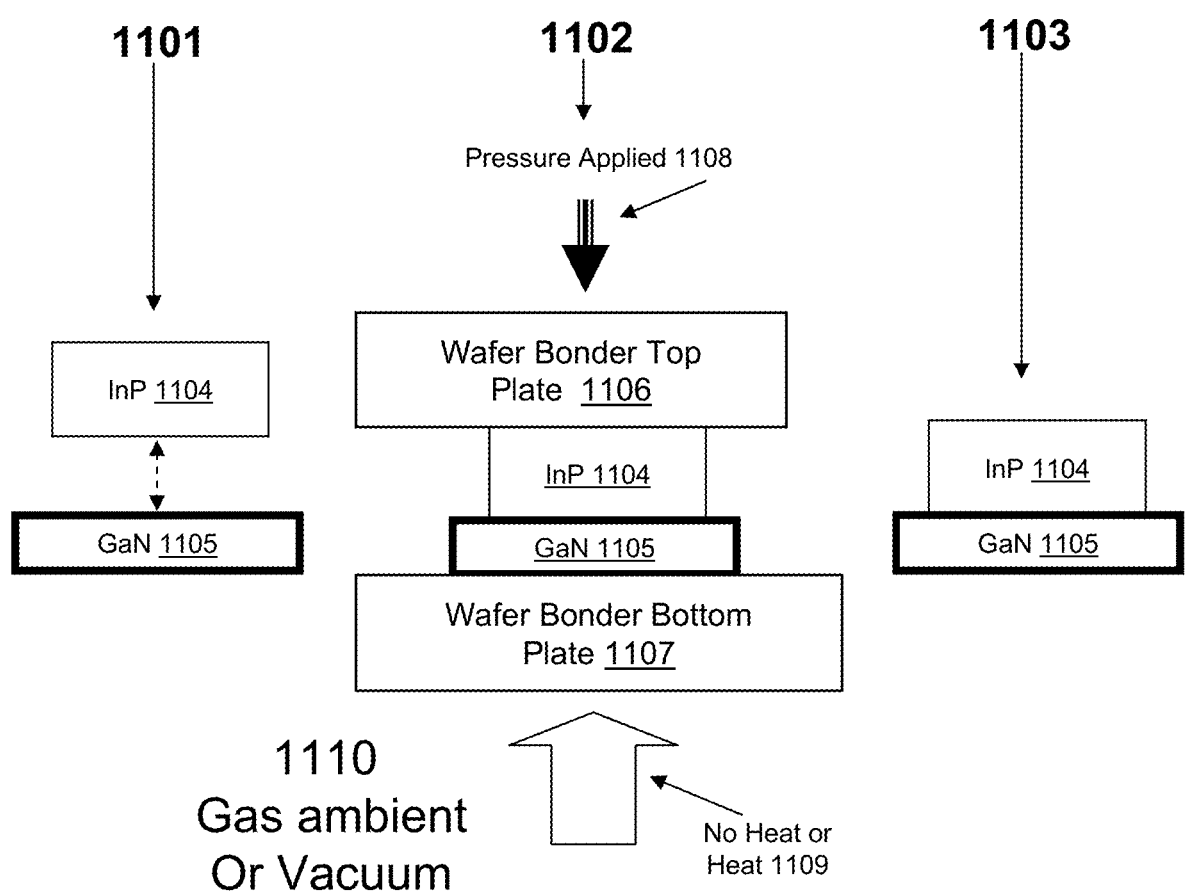
FIG. 11 shows a wafer bonding methodology for InP structure and GaN structure.

FIG. 11 shows the exemplary wafer bonding process that enables monolithic joining of two dissimilar semiconductor materials. The characteristics for wafer bonding may require proper surface preparation, surface cleaning, suitable surface roughness, pressure, heat, gas ambient, vacuum and time, for the formation of a monolithic composite structure. The new composite material may establish an InP to GaN heterointerface. Wafer bonding allows formation of a heterointerface without having to perform heteroepitaxy of two poorly matched materials. An exemplary wafer bonding methodology may comprise step 1101 where the InP 1104 and GaN 1105 semiconductors are cleaned in preparation for joining, step 1102 the InP 1104 and GaN 1105 are placed on each other in between the wafer bonder top plate 1106 and wafer bonder bottom plate 1107, basically the jaws of the wafer bonder, and may be held under no heat or heat 1109 and pressure applied 1108 for the requisite time and in a gas ambient or vacuum 1110, then step 1103 the final structure is a monolithic composite material of InP 1104 wafer bonded to GaN 1105. There are many challenges and alternative visions for producing high performance monolithic HEMTs that may be advantageously designed, formed and manufactured. Standard technologies for forming these devices have been limited by the number of compatible materials, due to the lattice matched constraint. The growth of InP HEMTs on typical wurtzite GaN materials due to huge mismatch and different crystal structure would be extremely difficult.

The design of both the epitaxial structure of the InGaAs HEMT and the GaN HEMT may utilize standard materials that are commercially available. The InGaAs HEMT can be grown inverted (i.e., in the opposite growth order from conventional devices) on a sacrificial InP substrate that is completely removed for wafer bonding the device to the GaN template substrate. It should be noted this technique is not limited to InP devices, but GaAs, Si devices and other types of devices can be wafer bonded in a similar way. Note the wafer bonded interface may have additional growth layers on the GaN device like AlGaN alloy or InGaN alloy or InAlN Alloy or thin InN or other layers to promote adhesion and enhance electrical properties. Also the InP or GaAs or Si surface may be coated with thin GaAs or AlAs or InGaAs or Ge or GeSn or SiGe or others, etc., to promote adhesion and enhance electrical properties.

The GaN HEMT may be grown on 4H SiC or other SiC Polymorphs or other substrates such as GaN or Si or Sapphire or Diamond or GaAs. The AlGaN layer may be near latticed matched to the 4H SiC. The device structure of the GaN HEMT is shown in Table 5.

TABLE 5

Exemplary Epitaxial Structure of GaN HEMT

| Layer | Layer Name | Description | Comment |
|---|---|---|---|
| 1 | UID | 100 Å AlGaN Intrinsic | A 24% Al content can be different based on thickness or applications. The Al composition changes can be introduced for different levels of tensile or compressive strain. (Al can be from 0% to 40%). Thickness can be varied from 0 Å to 1000 Å. |
| 2 | UID | 15,000 Å GaN Intrinsic | Thickness of this layer can be from 1,000 Å to 50,000 Å. |
| 3 | UID | 200 Å GaN nucleation layer | May be AlN. Thickness is variable. |
| 4 |  | 4 H SiC substrate | Other forms of SiC Polymorphs or GaN or Si or Sapphire or Diamond substrates can be used. |

UID Unintentionally doped

Note:
the structure, materials, compositions, thicknesses, dopants, and doping levels are exemplary and does not preclude other possible structures, materials, compositions, combinations or values.

For the InP HEMT, this material can be wafer bonded onto the GaN on SiC substrates (or other substrates such as GaN or Si or Sapphire or Diamond), and the InP HEMT which may be grown on an InP substrate, can be grown in an inverted configuration. The epitaxial structure of the inverted InGaAs HEMT is shown in Table 6 and can be routinely grown by commercial vendors.

TABLE 6

Epitaxial Structure of Inverted InP HEMT

| Layer | Layer Name | Description | Comment |
|---|---|---|---|
| 1 | UID | 1000 Å $In_{0.52}Al_{0.48}As$ | Wafer bond layer. |
| 2 | Channel | 20 Å $In_{0.65}Ga_{0.35}As$ |  |
|  | Channel | 30 Å InAs | Composite channel. |
|  | Channel | 15 Å $In_{0.65}Ga_{0.35}As$ |  |
| 3 | UID | 20 Å $In_{0.52}Al_{0.48}As$ | Spacer layer. |
| 4 | Delta doping | Si delta doping $5 \times 10^{12}$ $cm^{-2}$ | Delta doping. |
| 5 | UID | 150 Å $In_{0.52}Al_{0.48}As$ | Barrier layer. |
| 6 | N$^+$ contact | 150 Å $In_{0.53}Ga_{0.47}As$ Si-doped = $6 \times 10^{18}$ $cm^{-3}$ | Contact layer. |
| 7 | UID | 300 Å $In_{0.52}Al_{0.48}As$ | Etch stop. |
| 8 | UID | 100 Å $In_{0.53}Ga_{0.47}As$ Semi-insulating InP substrate | Etch stop. Sacrificial layer. |

Note:
the structure, materials, compositions, thicknesses, dopants, and doping levels are exemplary and does not preclude other possible structures, materials, compositions, combinations or values.

Figure 12:
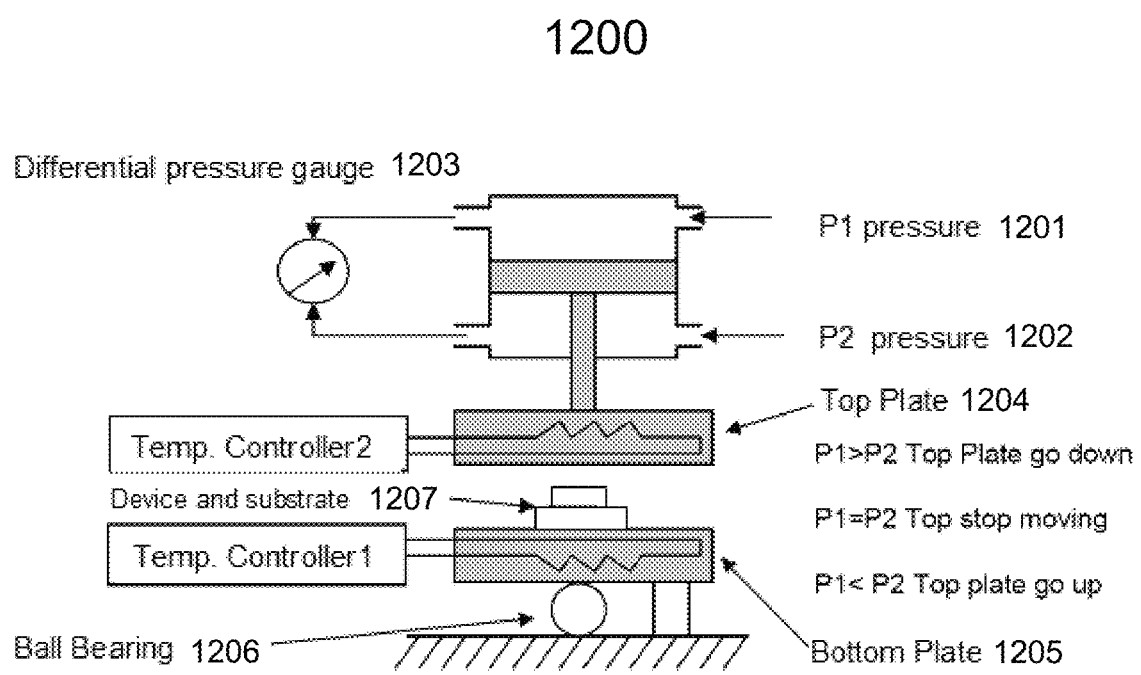
FIG. 12 shows a schematic diagram of a possible wafer bonder configuration.

The wafer bonding may allow gradual pressure application for the delicate bonding of InP structure and GaN. The large sized plates provide for a uniform bonding process. The wafer bonder has a self-leveling action to the surface mechanism and ensures that it is flat with the surface. The wafer bonder can accommodate up to 4" wafers. FIG. 12 shows the wafer bonder configuration 1200. The bonder uses differential air pressure between P1 pressure 1201 and P2 pressure 1202, where the pressure is measured by the differential pressure gauge 1203. The pressure controls the action of the top plate 1204 in moving down to clamp the device and substrate 1207, which sits on the bottom plate 1205, which has a ball bearing 1206 for conformal leveling action. Two independent temperature controllers control the temperature of the top plate 1204 and bottom plate 1205. Table 7 shows the exemplary wafer bonding process for InP to GaN.

TABLE 7

The Exemplary Wafer Bonding Procedure for InP and GaN

| Step | Description |
|---|---|
| 1 | Semiconductor materials are thoroughly cleaned using the ultra pure clean process that includes surface preparation and cleaning method to change and modify the surface morphology, spatial configuration, and interface surface activation energy of the two contact materials that results in wafer bonding of the two materials. |
| 2 | Oxides of the two materials are removed from the surfaces by the chemical etchants, dry etchants, and other etchants. |
| 3 | InP heterostructure and the GaN HEMT wafer are placed on top of each other. |
| 4 | InP and GaN materials are placed in the wafer bonder in various gas ambient or vacuum. The wafer bonder holds the materials together at room temperature and up to 600° C. for possible process time of few minutes to less than 1 hour. Air pressure is used to force the pieces together. |
| 5 | The composite structure is slowly cooled and then removed. |
| 6 | The composite unit acts as a monolithic structure that is wafer bonded. |

The GaN template substrate can be used for mechanical strength, but also can be part of the electrical circuit. For lateral device geometries, the GaN template substrate can be used for mechanical strength. For vertical device geometries, the GaN may be grown on a conducting substrate such as in monolithic integration of vertical FETs. Note the GaN collector template substrate could have a layer to electrically enhance performance, which can be deposited by any other epitaxial process. There are many other seed layers that could be used for this purpose, like AlGaN or InGaN or InAlN or InN, but not limited to these materials. The seed layer could be used for adhesion or modifying the electrical interface properties of the heterojunction to improve performance or reliability.

Figure 13:
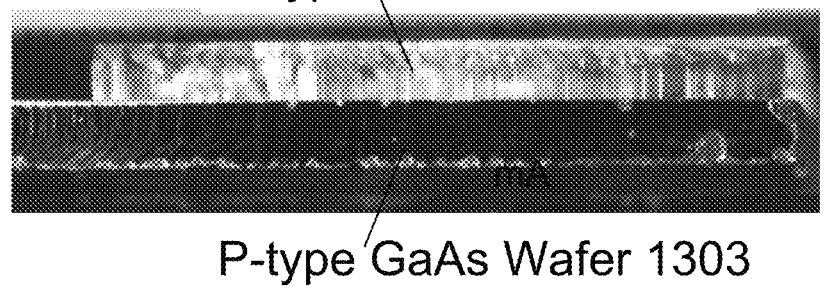
FIG. 13 shows a cross-sectional image of the interface of P-type GaAs to N-type GaN wafer bonded structure and the corresponding I-V off the curve tracer, showing a good diode characteristic.
Figure 13:
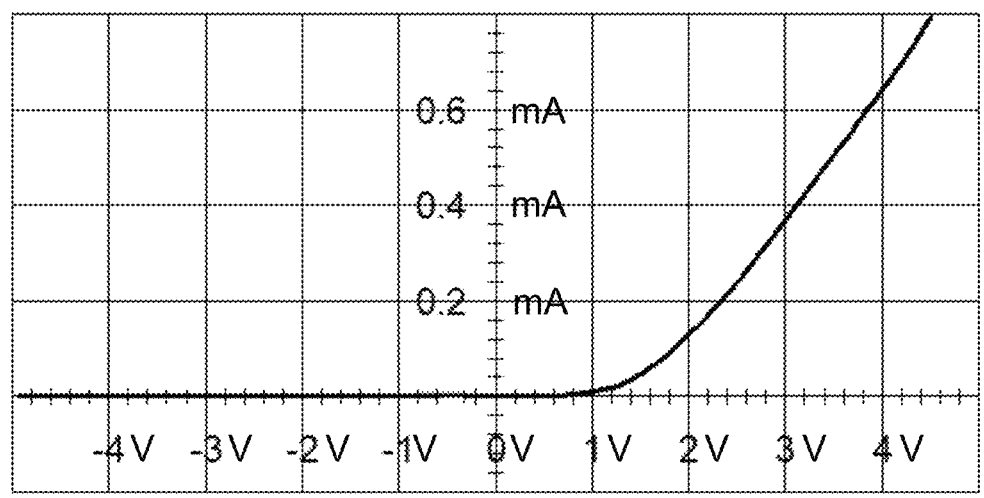

GaAs may be a face centered cubic (FCC) structure and the GaN crystal may be a wurtzite crystal structure. GaAs which has a larger lattice mismatch with GaN can be wafer bonded together. In one possible exemplary example a P-type GaAs wafer may be wafer bonded to an N-type GaN single crystal. FIG. 13 shows the cross-sectional picture 1300 of the interface of P-type GaAs wafer 1303 wafer bonded to N-type GaN wafer 1302. The picture 1301 shows the curve tracer I-V of the P-type GaAs wafer that is wafer bonded to N-type GaN, showing a good diode characteristic. The curve tracer I-V may be a method to test the quality of the wafer bonded junction. Typically one does a breakdown test to see if the junction is weak, however this does not unambiguously determine the electrical quality of the wafer bonded interface. The curve tracer I-V characteristic of P-N junctions may be sensitive to interface quality. The turn-on voltage of the P-N junction corresponds to the bandgap energy of the GaAs. It may be useful to incorporate multiple device utilizing the intrinsic layer of the GaN HEMT. A possible integrated circuit may consist of a GaN HEMT where the intrinsic GaN channel may be exposed for wafer bonding of a emitter-base structure to form a heterojunction bipolar transistor HBT.

The following embodiment represents a possible way of integrating an InP HEMT to the normally-on GaN HEMT using the GaN HEMT as a template substrate providing for mechanical and thermal advantage. This possible novel solution for the formation of HEMT (high electron mobility transistor)-based MMIC transceivers utilizing a wafer bonding process that can be ideal for space applications is described in this embodiment. A cost-effective quick-turn wafer bonding technology (fast prototyping) may reduce cycle time and cost for making integrated transceivers. One embodiment may be to integrate a GaN HEMT MMIC (RF power amplifier transmitter) with an InGaAs-channel HEMT MMIC (low-noise amplifier receiver) on a high thermal conductivity SiC substrate.

Wide bandgap semiconductors such as GaN with their large breakdown voltage and high mobility are ideal for the next generation high performance RF power transistors for applications requiring radiation hardness. The bandgap energy is the minimum energy for the creation of electron-hole pairs, thus materials like GaN with significantly large bandgap energies are inherently radiation hard. GaN HEMT devices (in particular AlGaN/GaN) are extremely radiation tolerant and the reliability of these devices has been well studied.

Figure 14:
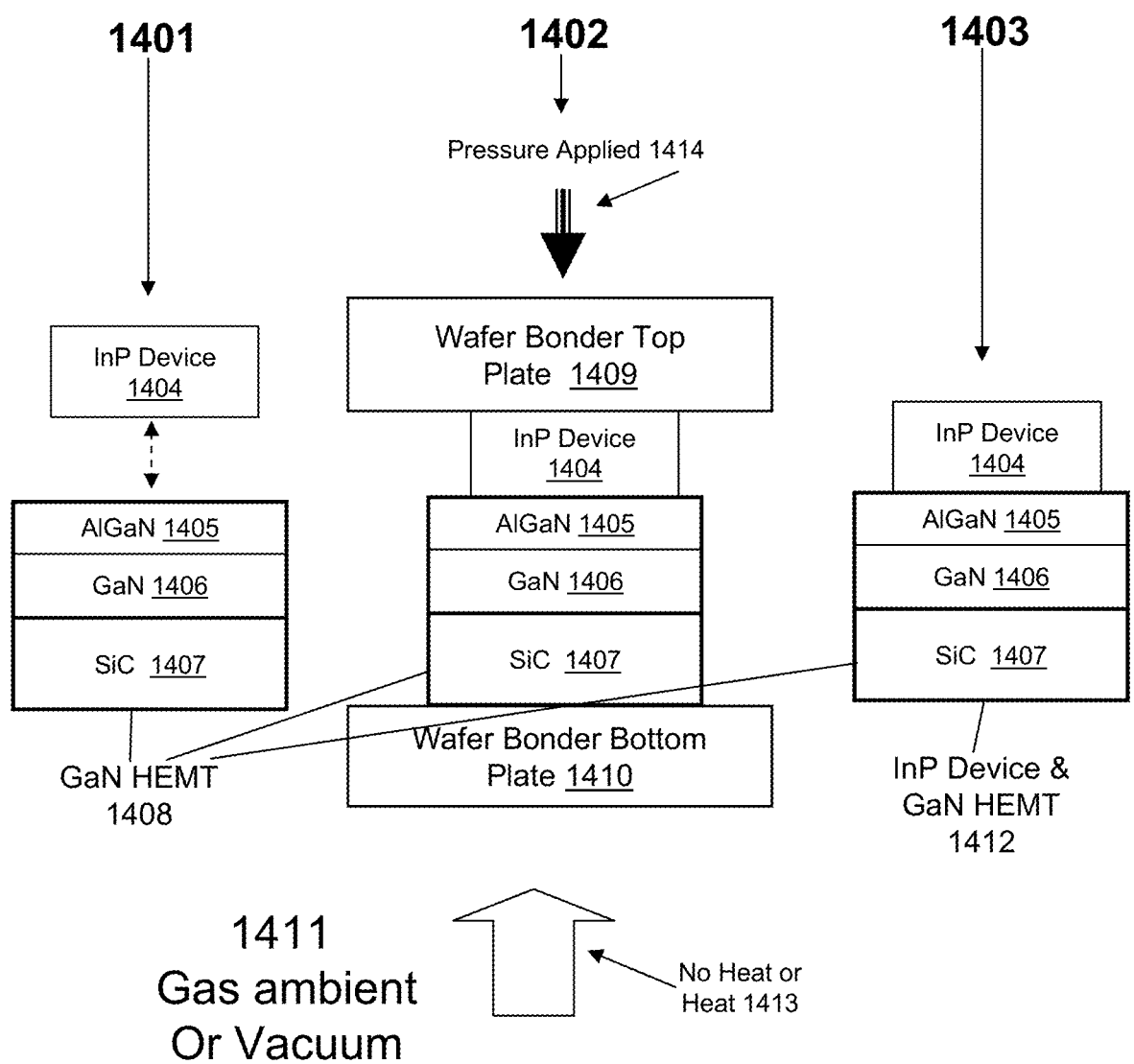
FIG. 14 shows a schematic of the wafer bonding process of joining an InP device to a GaN HEMT.

Using wafer bonding technology to integrate InGaAs Device (may be a HEMT) with the GaN HEMT/Template Substrates may be a useful way to form monolithic integrated circuits. The InGaAs HEMTs on InP substrates layer may be wafer bonded to the top AlGaN layer of the GaN HEMT substrates. FIG. 14 shows a possible exemplary methodology. Wafer bonding allows formation of a hetero-interface without having to perform heteroepitaxy of two poorly matched materials. An exemplary wafer bonding methodology may comprise step 1401, where the InP Device 1404 and GaN HEMT 1408 are cleaned in preparation for joining. GaN HEMT 1408 consists of a top surface AlGaN 1405 barrier layer grown on the GaN 1406 channel, which may be grown on a SiC 1407 substrate, but may be also grown on various polymorphs of SiC or Si or Sapphire or GaN or Diamond or GaAs. Step 1402, the InP Device 1404 and GaN HEMT 1408 are placed on each other in between the wafer bonder top plate 1409 and wafer bonder bottom plate 1410, where the InP Device 1404 may be in contact with the AlGaN 1405 surface. The two devices may be held in the jaws of the wafer bonder, and may be held under no heat or heat 1413 and pressure applied 1414 and in a gas ambient or vacuum 1411 for the requisite time. Step 1403, the final structure is a monolithic composite material of InP Device 1404 wafer bonded to GaN HEMT 1408 to form a monolithically wafer bonded InP Device & GaN HEMT 1412. Note the wafer bonded interface may have additional growth layers on the GaN device like AlGaN alloy or InGaN alloy or InAlN alloy or thin InN or other layers to promote adhesion and enhance electrical properties. Also the InP or GaAs or Si surface may be coated with thin GaAs or AlAs or InGaAs or Ge or GeSn or SiGe or others, etc., to promote adhesion and enhance electrical properties.

There are many challenges and alternative visions for producing high performance monolithic HEMTs. Standard technologies for forming these devices have been limited by the number of compatible materials, due to the lattice matched constraint. The growth of InP HEMTs on typical wurtzite GaN materials due to huge mismatch and different crystal structure would be extremely difficult. This technique is not limited to InP to GaN but a multitude of devices can be integrated this way. The surfaces to be bonded may be modified to promote adhesion, mechanical strength, and enhance electrical and optical performance. Possible methods include growing additional materials on the GaN like a thin InGaN layer or a thin AlGaN layer or a thin InAlN layer or a thin layer InN. These can be grown at numerous different In or Al compositions. Note the GaN template substrate could have a layer to electrically enhance performance, which can be deposited by any other epitaxial process. The seed layer could be used for adhesion or modifying the electrical interface properties of the heterojunction to improve performance or reliability. Also the material on the InP device may be InP or it could be InGaAs or InAlAs or InAs at various compositions.

A space qualifiable heterogeneous MMIC (microwave monolithic integrated circuit) consisting of an InGaAs HEMT low noise/high speed amplifier monolithically integrated with a GaN HEMT power amplifier on a high thermal conductivity SiC substrate or GaN or Si or Sapphire or Diamond substrates may be useful for space, military and commercial applications. This technology seeks to leverage the transistor materials that are advantageously designed, formed and manufactured, and incorporates them for use as a new transceiver module that is radiation hard and space qualifiable. GaN-based materials have a large bandgap and high electron saturation velocity and are ideal for high power RF applications; and the InGaAs-channel HEMT can be grown lattice matched or pseudomorphic on InP substrates and are the technology of choice for low noise/high frequency applications.

The wafer bonding approach can readily use commercially available GaN HEMT MMICs and commercial InGaAs HEMT MMICs components, Si devices and GaAs devices for the multi-functional integrated circuits, which are independent of the lattice matched requirement and can be grown on a multitude of substrates. Wafer bonding technique may serve to monolithically bond the microelectronic chips to form a robust assembly on high thermal conductivity SiC or GaN or Si or Sapphire or Diamond substrates.

Figure 15:
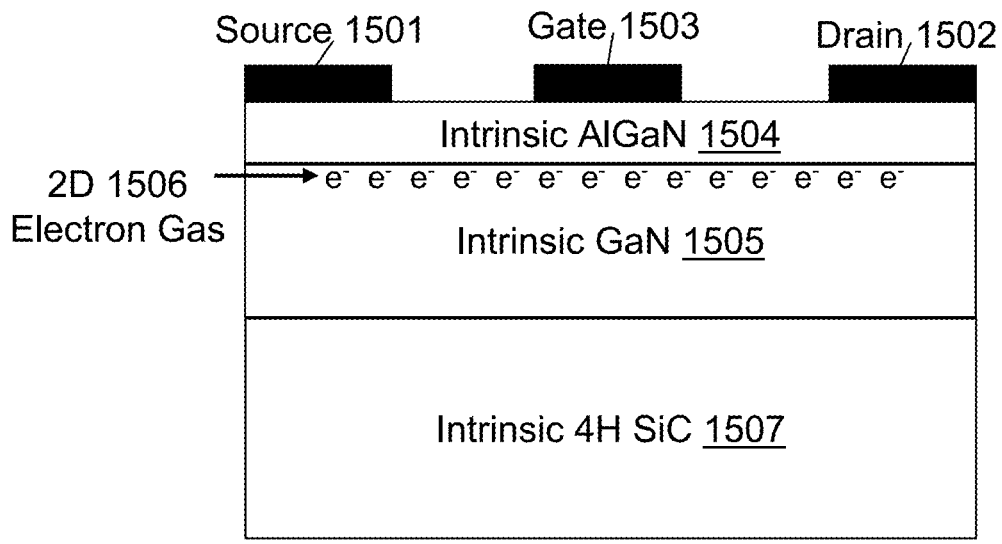
FIG. 15 shows the two different exemplary devices AlGaN/GaN HEMT and InGaAs/InP HEMT that can be merged by wafer bonding.
Figure 15:
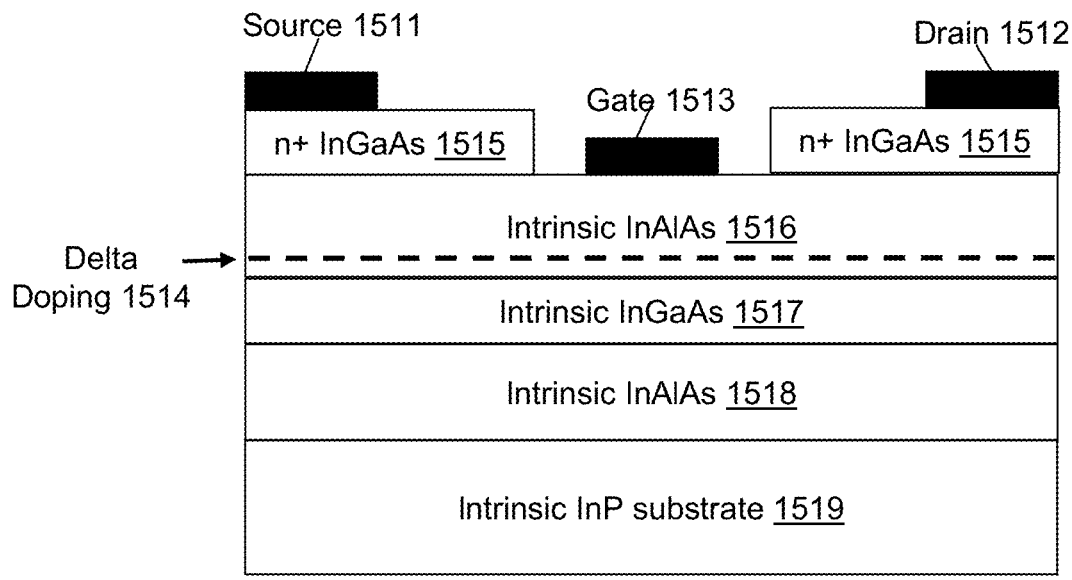

Wafer bonding may be a method to monolithically merge devices such as a low noise InGaAs/InP HEMT MMICs with an RF high power amplifier AlGaN/GaN HEMT MMICs. FIG. 15 depicts two exemplary devices that may be integrated by wafer bonding. An exemplary cross-sectional diagram of a depletion mode of normally-on GaN HEMT 1500, where a voltage between the drain 1502 and the source 1501 can be controlled by the gate 1503 voltage. The drain 1502 may be positively biased with respect to the source 1501. In this configuration electrons flow from the source 1501 to the drain 1502. The gate 1503 may be the third electrode that may form a rectifying contact to the channel. The positive bias on the drain may result in the depletion region which may be asymmetrically shifted toward the drain. The gate 1503 may control the current between the source 1501 and the drain 1502. The FET can be thought of as a voltage controlled resistor, where the resistance may be controlled by the depletion depth. Also geometrical considerations of the device layout may be important for performance of FET devices. The gate 1503 metal may form a Schottky barrier to the intrinsic AlGaN 1504, and the source and drain form ohmic contacts to the intrinsic AlGaN. The electric field at the AlGaN 1504 and GaN 1505 interface from the polarization confines the electrons two dimensionally, thus forming a two dimensional 2D 1506 electron gas or 2D sheet charge. The gate forms a Schottky barrier to the intrinsic AlGaN barrier and the source and drain form ohmic contacts to the intrinsic AlGaN barrier. The intrinsic GaN 1505 may be grown on a 4H SiC 1507 or on a SiC Polymorph substrates or on a Si substrate or on a GaN substrate or on a Sapphire substrate or on a GaAs substrate or on a Diamond substrate. The second device shows an exemplary cross-sectional schematic diagram of normally-on InP HEMT 1510. The delta doping 1514 layer allows the formation of a 2D electron gas at the InAlAs 1516-InGaAs 1517 heterointerface, this HEMT structure can increase the mobility without decreasing the sheet carrier concentration of the device. The epitaxial structure starting with the InP substrate 1519, may have an InAlAs 1518 buffer, an InGaAs 1517 channel, an InAlAs 1516 spacer/barrier (separates delta doped layer from the channel), delta doping 1514, and an N$^+$ InGaAs 1515 contact layer. The source 1511 makes ohmic contact to the N$^+$ InGaAs 1515 layer, and the drain 1512 makes contact to the N$^+$ InGaAs 1515 layer. The gate 1513 makes contact to the InAlAs 1516 barrier. The lattice matched InAlAs 1518 buffer to the InP substrate 1519 eliminates misfit dislocation which can hurt the crystallinity of the device. The spacer layer thickness and composition may be critical (determines the gate Schottky, transconductance, threshold voltage and resistance between the channel and the contact layer). The two layers to be wafer bonded are the InP substrate 1519 of the InP HEMT 1510 to the AlGaN 1504 layer of the GaN HEMT 1500. This type of device may be useful for a transceiver where the GaN HEMT may be an RF transmitter and the InP HEMT may be a low noise receiver. Through wafer bonding it may be possible to create a monolithic transceiver incorporating a GaN HEMT and an InP HEMT.

Figure 16:
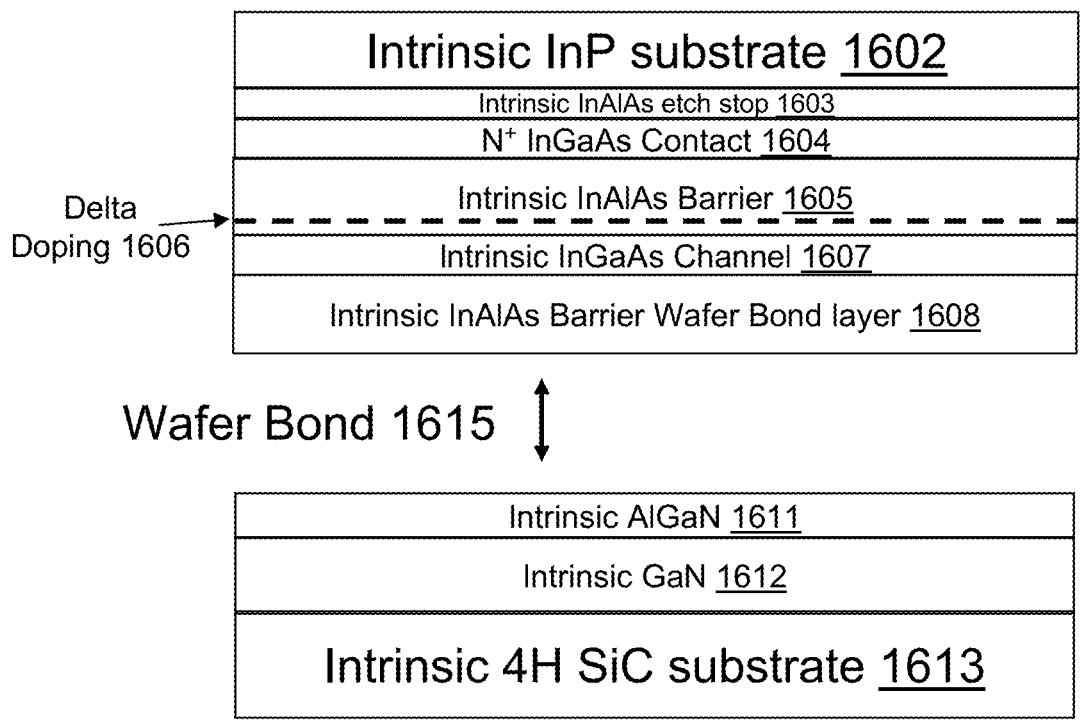
FIG. 16 shows an exemplary schematic diagram of the wafer bonding process for joining the InP epi-wafer to the GaN epi-wafer.

FIG. 16 describes an exemplary process of the wafer bonding procedure to form an integrated GaN HEMT and InP HEMT. In description, an inverted InP HEMT epi-structure 1601 may be similar to Table 6. Starting from the InP substrate 1602, an InAlAs etch stop 1603 layer is grown, followed by the N$^+$ grown inverted to the substrate where the N$^+$ InGaAs Contact 1604 layer is grown, followed by an InAlAs Barrier 1605 which has a delta doping 1606 layer to control the 2D sheet charge, then followed by the InGaAs channel 1607, finally ending with an InAlAs barrier wafer bond layer 1608. The GaN HEMT Epi-Structure 1610 consists of a 4H SiC substrate 1613, which a GaN 1612 layer is grown, followed by AlGaN 1611 layer. The exemplary structure is shown in Table 8 of the AlGaN/GaN/SiC HEMT that can be used both as a device and a template substrate to bond other multi-functional devices. The two epi-structures can be joined monolithically by the wafer bond 1615.

TABLE 8

Exemplary Epitaxial Structure of GaN HEMT

| Layer | Layer Name | Description | Comment |
|---|---|---|---|
| 1 | UID | 200 Å AlGaN | A 24% Al content can be different based on thickness or applications. The Al composition changes can be introduced for different levels of tensile or compressive strain. (Al can be from 0% to 40%). Thickness can be varied from 0 Å to 5000 Å. |
| 2 | UID | 16,000 Å GaN | Thickness can be varied from 1,000 Å to 50,000 Å. |
| 3 | UID | Nucleation buffer | May be AlN. Thickness is variable |
|  |  | 4H SiC substrate | Also other SiC Polymorphs or GaN or Si or Sapphire or Diamond or GaAs. |

UID Unintentionally doped. The thicknesses and compositions are only guidelines.

Note:
the structure, materials, compositions, thicknesses, dopants, and doping levels are exemplary and does not preclude other possible structures, materials, compositions, combinations or values.

One exemplary methodology to fabricate the monolithic InP HEMT and GaN HEMT may start out with fiducial etch markers that are etched into the GaN HEMT wafer. These are used as alignment marks for the subsequent GaN and InP HEMT processing steps. The GaN HEMT isolation is performed using oxygen implant isolation with a mask relative to the fiducial markers. GaN HEMT 4" wafers with the fiducial alignment mark is wafer bonded to the inverted InP HEMT wafer. Standard 4" full wafers can be bonded and processed for manufacturability. After bonding, conventional mask aligning with an IR camera is used to register subsequent processing steps to the (now buried) etched fiducials.

The device fabrication of monolithically integrated InP HEMT and GaN HEMT in one exemplary process is shown in Table 9, which shows a possible process flow for the fabrication of the devices.

Figure 17:
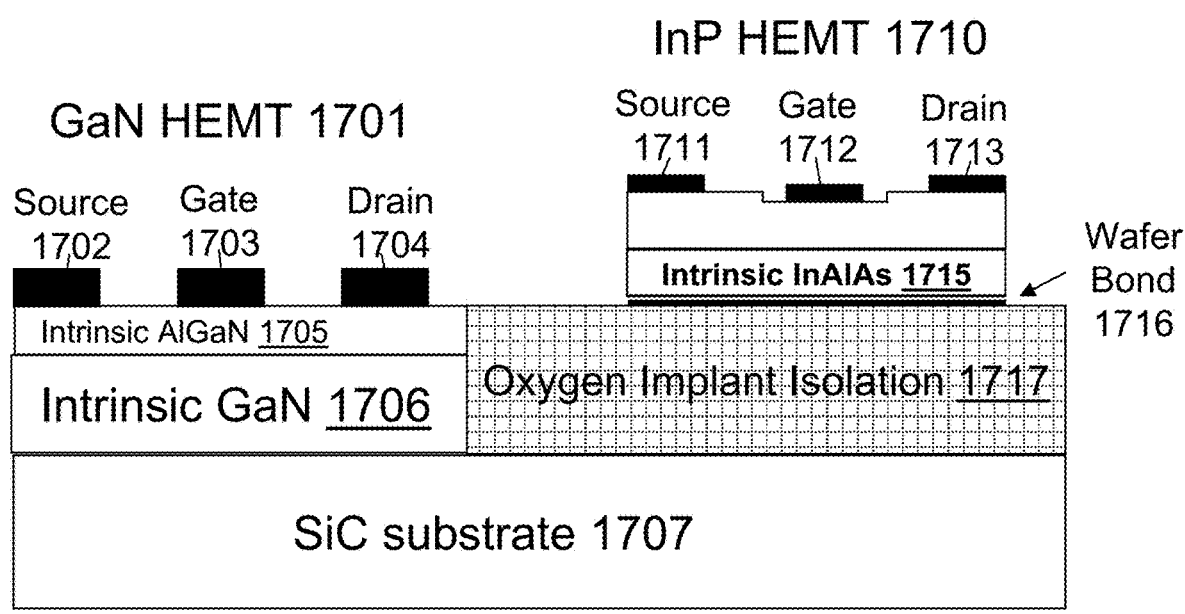
FIG. 17 shows a representational cross-section of the monolithically integrated InP HEMT and GaN HEMT.

FIG. 17 shows an exemplary cross-sectional view of the InP HEMT 1710 and GaN HEMT 1701 monolithically wafer bonded. The oxygen implant isolation 1717 isolates the devices from each other. The intrinsic InAlAs 1715 of the InP HEMT 1710 may be used to further isolate the device and also is wafer bonded 1716 to the AlGaN 1705 layer which is in the oxygen implant isolation 1717 region. The GaN HEMT 1701 has source 1702, gate 1703 and drain 1704 that contacts the intrinsic AlGaN 1705. The InP HEMT 1710 has source 1711 and drain 1713 that contacts the $N^+$ InGaAs contact layer 1604 in FIG. 16 and the gate 1712 contacts InAlAs 1715 (1605 in FIG. 16) barrier through a recess etch.

Another possible exemplary method of making multi-functional integrated circuits may be to utilize commercially available circuits or already fabricated devices for integration with the GaN devices by utilizing the GaN device as a template substrate. To make such a process the GaN photomask set for every die may include a drop-out field (open area) to accommodate wafer bonding of a (smaller) device die. There are numerous commercially available devices that

TABLE 9

Process Flow for the Device Fabrication of Monolithic InP HEMT and GaN HEMT

1. Fiducial definition and etching (ICP-RIE) on the GaN HEMT heterostructure.
2. Oxygen implant isolation of GaN HEMT wafer.
3. Wafer bond (face to face) of inverted InP HEMT and GaN HEMT.
4. Remove InP substrate at the InAlAs stop etch layer, exposing the $N^+$ InGaAs contact layer. Pre-thinning by wafer grinding, followed by sequential selective wet etch to stop on InGaAs contact layer. The InGaAs-channel HEMT structure, now sits on the AlGaN layer of the GaN HEMT.
5. InGaAs-channel HEMT isolation by wet etching.
6. GaN HEMT ohmic contact definition and deposition. To protect the InGaAs-channel HEMT and the GaN surface during the anneal, a SiNx mask is used (LPCVD). An alloyed Ti/Al/Mo/Au ohmic contact metallization (by electron beam evaporation), followed by rapid thermal annealing is used. This can achieve a contact resistance below 0.5 Ω-mm. Removal of the SiNx mask by wet etching.
7. InGaAs-channel HEMT ohmic contact definition, using photolithography and conventional AuGe/Ni/Au metallization and annealing. The lower temperature (~350° C.) of this anneal does not require protection of the GaN device.
8. GaN and InGaAs channel HEMT gate definitions and depositions. Definition (by optical or electron beam lithography) of the gate electrode, followed by deposition of a Ni/Au gate (for GaN devices) or Ti/Pt/Au gate (for InGaAs devices) by electron beam evaporation. A gate recess is performed immediately prior to gate deposition for the InGaAs devices; no recess is needed for the GaN channel HEMTs.
9. Passivation of the devices using LPCVD or PECVD-based SiNx.
10. Definition and deposition of field plate metallization using conventional evaporation and lift-off for the GaN channel devices. A single source-connected field plate is envisioned, but more sophisticated designs could be implemented.

Note:
For the InP HEMT after the removal of the InP, only the InGaAs channel HEMT structure is left.

Figure 18:
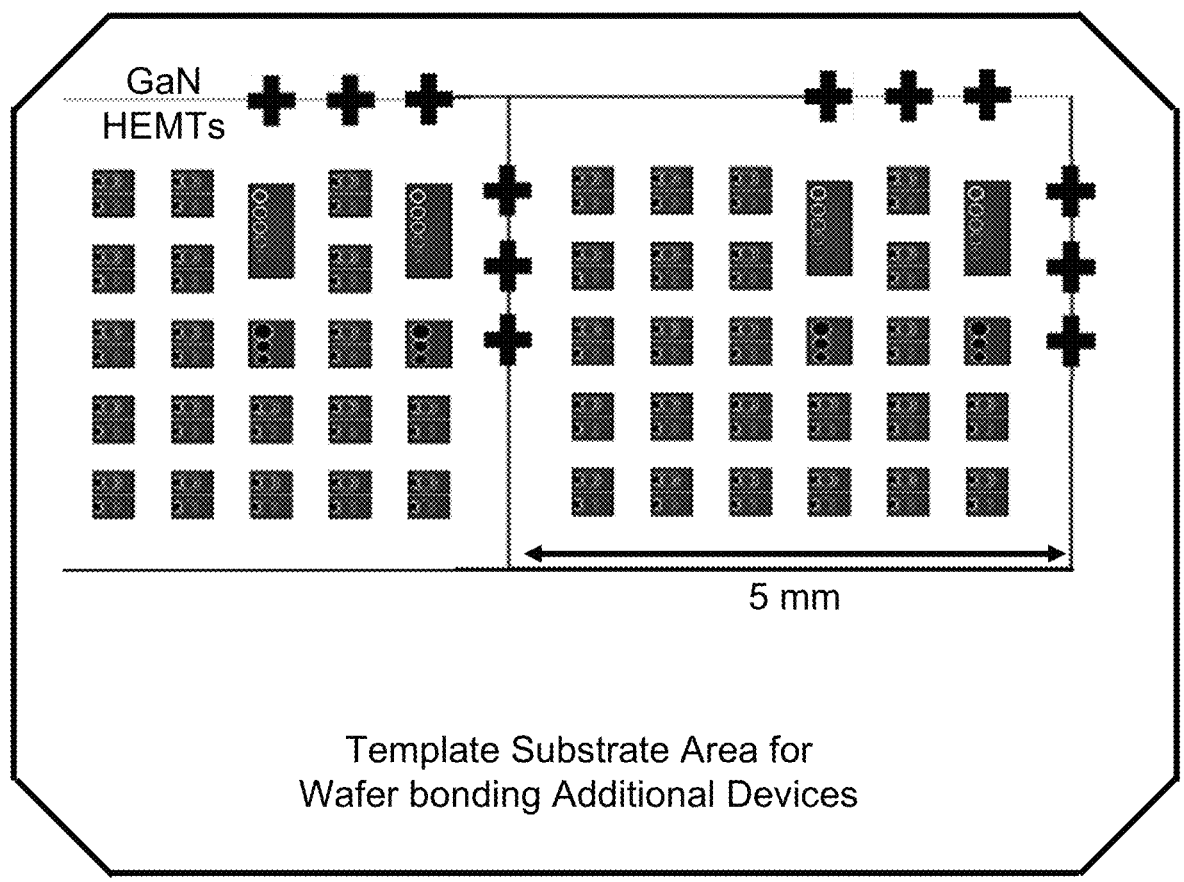
FIG. 18 shows the two 5 mm×5 mm die of the fully fabricated GaN HEMTs and the corresponding drop-out field (open area) acts as a template substrate for the wafer bonding of additional devices.

Note:
This may be an exemplary process and does not preclude other process sequences to make the device could be integrated in this way. To obtain an open area for wafer bonding of a fully processed or commercially available device like an InP HEMT low noise amplifier to the GaN HEMT substrate, without extensive process and circuit development, a drop-out field during lithography is used for the bonding of more devices and components. FIG. 18 shows an example of a fabricated GaN HEMT with two 5 mm×5 mm die, and the corresponding drop-out field open area (template substrate area) toward the bottom of the image, where the InP HEMT or other devices can be wafer bonded. The figure shows two 5 mm×5 mm die where various GaN HEMTs are fully fabricated showing two types of RingFETs, CV diodes, and circular TLM structures. The corresponding drop-out field (open area) acts as a template substrate for the wafer bonding of the InP HEMT MMIC and additional devices. The GaN HEMT may serve two purposes: 1) as the high power RF PA which needs to be grown on SiC for heat extraction (or grown on other substrates such as GaN or Si or Sapphire or Diamond or GaAs); and 2) as the template substrate for wafer bonding the additional fabricated devices. The template substrate has an open field area for the bonding of additional devices. It may be possible to get numerous devices in die form and these could be wafer bonded to the open template of the GaN HEMT wafer. Additional devices may include: Si MOSFET, SiGe HFET, SiGe HBT, and Si photo-diodes.

Figure 19:
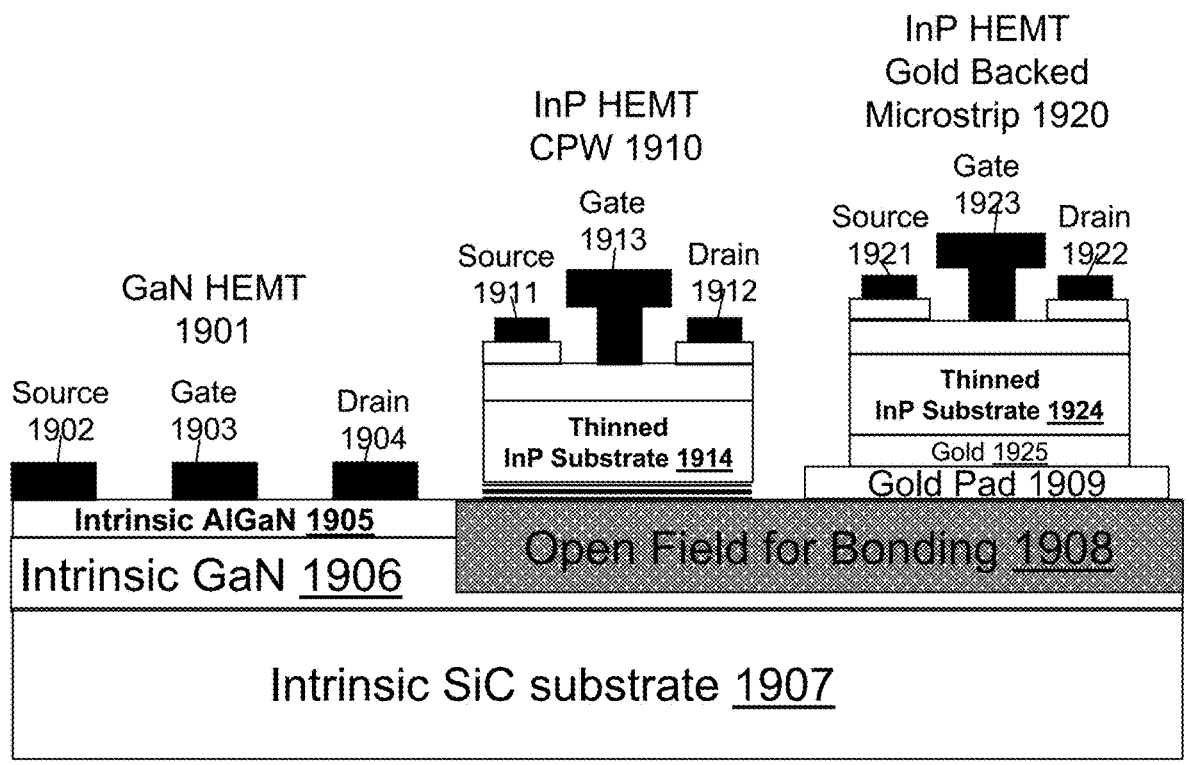
FIG. 19 shows the wafer bonded composite monolithic circuit on a high thermal conductivity SiC substrate, with an InP HEMT co-planar waveguide (CPW) and an InP HEMT gold-backed microstrip that may be wafer bonded to a GaN HEMT with the corresponding open field area.

The use of 0.1 and 0.25 micron gate discrete RF GaN HEMTs for high performance includes the layout of a drop-out field (open area) to act as the high thermal conductivity SiC template substrate for wafer bonding of the InP HEMT for the low-noise amplifier receiver, and makes for a unique transceiver. The devices require use of 4 mask levels. The size of the samples from the 4" wafer measures 13 mm×13 mm. This is required because the die size is 10 mm×10 mm. The photoresist (PR) edge bead removal process eliminates 1.5 mm from the edge, thus the sample size of 13 mm×13 mm accommodates four 5 mm×5 mm die in the interior. The GaN HEMT can have two 5 mm×5 mm die in the 13 mm×13 mm piece and a drop-out field (open area) which acts as the template substrate for wafer bonding of the devices, e.g., InP HEMT low-noise amplifier. Table 10 shows the fabrication of GaN HEMT which consists of 4 mask levels.

based circuits successful wafer bonding process of the bare InP substrates to the AlGaN surface of the HEMT may be achieved. For the gold-backed microstrip and GCPW structures of the commercial die, a gold bonding landing pad is defined in the open field of the template substrate for gold to gold (Au-to-Au) wafer bonding. This wafer bonding methodology is versatile and allows for flexibility and integration of various devices and passive structures for the demonstration of a full transceiver. FIG. 19 shows an exemplary depiction of a composite device formed using commercially available InP HEMTs bonded onto the GaN device template substrate. FIG. 19 shows a possible device configuration of the wafer bonded composite MMIC on a high thermal conductivity SiC substrate, with an InP HEMT co-planar waveguide (CPW) and an InP HEMT gold-backed microstrip and grounded CPW (GCPW). Starting with a normally on GaN HEMT 1901 after device fabrication where the source 1902 metal and drain 1904 metal makes ohmic with the intrinsic AlGaN 1905, and the gate 1903 metal makes a Schottky barrier with the intrinsic AlGaN 1905 layer, the device is functional. The gate 1903 controls the current flow between the source 1902 and the drain 1904. A 2D electron gas forms at the heterointerface of the AlGaN 1905 and GaN 1906. For this exemplary scenario the GaN HEMT 1901 is grown on an intrinsic SiC substrate 1907 but other substrates such as Si or GaN or sapphire or diamond could be used. By utilizing photolithography one can have an open field for bonding 1908. On the open field for bonding 1908 one can monolithically bond various devices which may or not be gold-backed. Note in this case the bonding surface is the intrinsic AlGaN 1905 surface. One could also etch off this surface and bond to the intrinsic GaN 1906 surface. For example, but not the only type of embodiment, two different standard devices can be integrated to this GaN HEMT 1901 device. An InP HEMT CPW 1910 which may be comprised of a source 1911, drain 1912, and gate 1913 on a thinned InP substrate 1914 can be integrated to the chip by wafer bonding. This device has only a bare thinned InP substrate 1914 to wafer bond for attachment. An InP

TABLE 10

Fabrication of GaN HEMT: Consists of 4 Mask Levels

1 Mesa isolation etch for RF HEMT "U" FET.
2 GaN HEMT source and drain definition and metal lift-off. Device size: 13 mm × 13 mm.
3 GaN HEMT source and drain ohmic evaporation (Ti/Al/Ni/Au: 20/100/40/50 nm).
4 GaN HEMT RTA procedures for (Ti/Al/Ni/Au 20/100/40/50 nm) alloy at 845° C. 30 seconds.
5 Photolithograph for GaN HEMT 2 micron and 10 micron gate definition lift-off.
6 E-Beam definition of 0.25 micron and longer gate structures.
7 GaN HEMT gate Schottky metal evaporation (Ni/Au: 20/1900 nm).
8 GaN HEMT passivation.

Note:
This may be an exemplary process and does not preclude other process sequences to make the device For commercially available parts or devices that have been fully fabricated may be integrated to GaN devices, the open field area may be a straight forward method to make the multi-functional integrated circuit. A commercially available InP HEMT die may include gold-backed substrates for gold to gold wafer bonding. This can be accomplished by gold metallization of the GaN HEMT in the open field area prior to wafer bonding of the gold-backed InP device. Also the AlGaN/GaN HEMT on SiC serves as the high thermal conductance template substrate.

The process may be designed to be able to accommodate commercially available InP HEMT MMICs fabricated with either co-planar waveguide (CPW) or gold-backed microstrip and grounded CPW (GCPW). For the CPW- HEMT gold-backed microstrip 1920 die can be attached to the GaN HEMT 1901 wafer, where a gold pad may be photolithographically defined on the open field for bonding 1908, and then may be attached to the GaN HEMT 1901 by gold to gold wafer bonding. An InP HEMP gold-backed 1920 may be comprised of a source 1921, drain 1922, and gate 1923. The final device is exemplary where three different devices have been monolithically integrated for multi-functionality. Numerous other types of electronic or photonic devices can be integrated in this manner. Fully functional devices that are commercially available or fully processed devices can be readily integrated to the GaN HEMT 1901 with the open field for bonding 1908. This illustration shows an exemplary normally-on GaN HEMT but a normally-off GaN HEMT could be also used.

The wafer bonder allows gradual pressure application for the delicate bonding of InP and GaN. The mechanism for application of force relies on air pressure, and the application of that force can be adjusted gradually and to increase uniformly. The top and bottom plates are under electronically controlled differential air pressure; therefore, there is no concern about needing a non-linear spring force. The custom bonder has a self-leveling action to the surface mechanism and ensures that it is flat with the surface. The wafer bonder has high-capacity heaters in the plates that provide fast temperature ramp rates, and are equipped with independent temperature control on for both the top and bottom plates.

The wafer bonder enables wafer bonding the small sized thinned and gold-backed fully fabricated MMIC die to a common SiC Polymorphs or GaN or Si or Sapphire or Diamond substrate by employing: 1) an electrically insulating high thermal conductivity AlN surface on the top plate; 2) capability for vacuum wafer bonding; 3) bottom-side viewing through the transparent SiC substrate (or other substrates) during bonding; and 4) the ability to accommodate gold-backed die typical of commercial parts.

The thermal expansion coefficients between materials may be considered in preparing these materials for wafer bonding. The thermal expansion coefficient of InP may be ~4.75×10$^{-6}$ K$^{-1}$ and GaN may be ~5.6×10$^{-6}$ K$^{-1}$. When bonding such dissimilar materials, the thermal mismatch may cause different amounts of thermal expansion and may result in stress on the materials during both annealing and cooling. This thermal expansion coefficient difference causes thermal stress that can result in cracks and bond separation. Thus low pressure and low temperature annealing may be desired to reduce strain; however under these conditions it can be challenging to achieve strong surface adhesion.

Semiconductor materials are thoroughly cleaned using the ultra pure clean process that includes surface preparation and cleaning method to change and modify the surface morphology, spatial configuration, and interface surface activation energy of the two contact materials that results in wafer bonding of the two materials. The ultra pure clean process results in materials that may be devoid of contaminants and help in the oxide removal process. The wafer bonding process may need various cleaning, etching, and surface preparation methods with the primary targets of strong wafer bonds and high performances of device or material or integrated circuit. This includes solvent clean, scrub clean, ultrasonic clean, and spin clean, and also nitrogen and hot plate drying of samples. By using this process, dissimilar materials are wafer bonded.

Gold to gold wafer bonding of commercial MMIC die may not require all of the cleaning treatments of semiconductors, this is because gold is less prone to inorganic contaminations and oxides do not readily form on its surface. Instead a modified preparation method can be employed to clean and prepare the metal surfaces such as dry etching and UV-ozone treatment. The gold to gold MMIC die wafer bonding of commercial components can be readily achievable at low temperatures such as <300° C. Alternative approaches, such as anodic bonding, solder bonding and eutectic bonding for Au-to-Au bond, can cause brazing, irregular surface patterning, voids and create limitations on the gold bond pad—introducing fractures at the bond interface. Whereas, with the thermocompression (heat and pressure) technique the gold to gold surface process can be successfully managed and strong wafer bonding demonstrated at low temperatures such as <300° C. to qualify wafer package for commercial parts.

The use of the GaN device with an open template area for integration of devices can be significantly useful for multi-functional devices such as lasers, photo-detectors, passive RF circuitry, solar cells, light emitting diodes, light emitting transistors, photo-transistors, diodes, and any device that may be chip or die form. This includes devices that have been metalized on the back side, which can also be wafer bonded to the open template field of the GaN HEMT.

A semiconductor laser, VCSEL, emits light normal to the surface of the semiconductor wafer. This could be readily integrated onto the GaN template substrate yielding a process of having both electronic and photonic integrated circuits. The resonant optical cavity of a VCSEL may be formed with two sets of distributed Bragg reflector (DBR) mirrors located at the top and bottom of the laser, with the active region (which may be a quantum well or quantum wire or quantum dot region), sandwiched between the two Bragg reflectors. Note the designation of N DBR means that the DBR is doped N-type.

Figure 20:
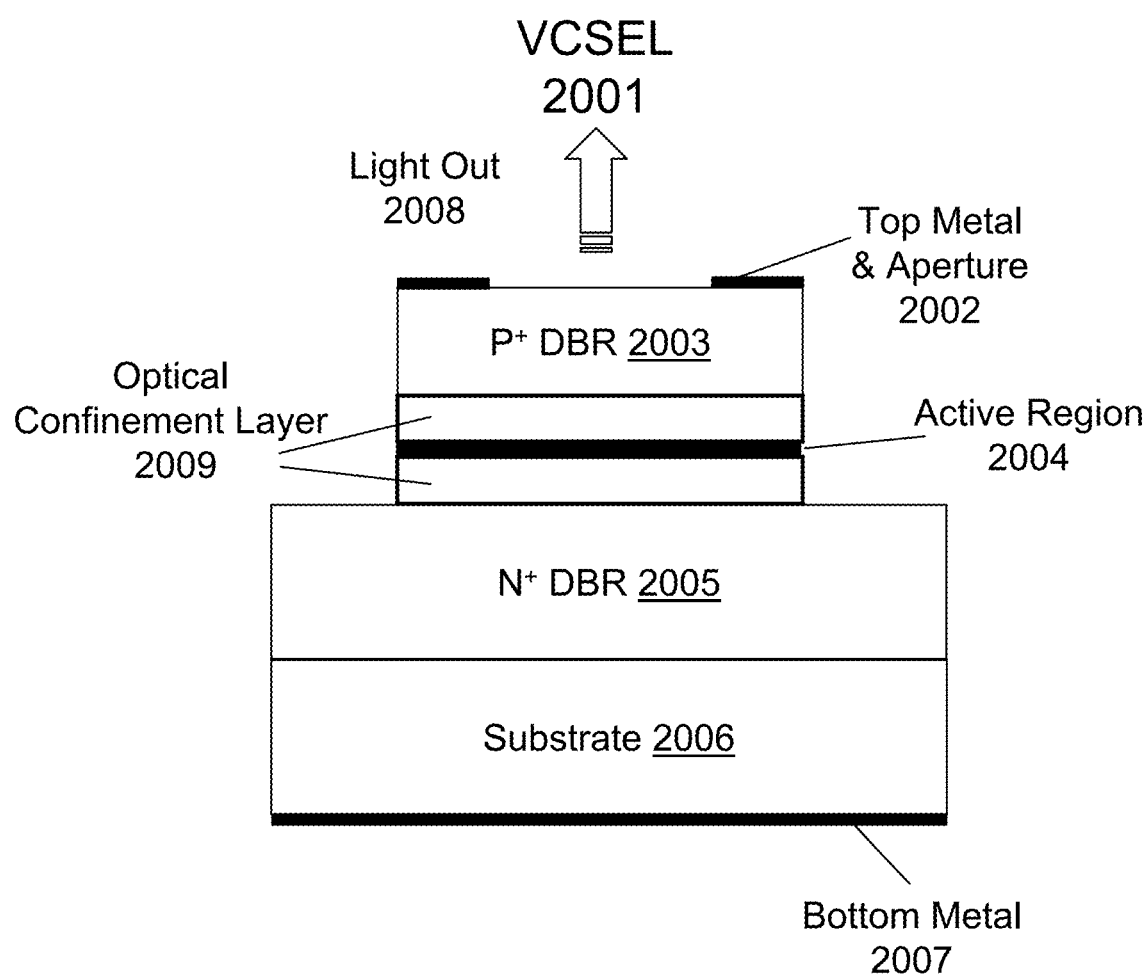
FIG. 20 shows an example of a cross-sectional device depiction of a VCSEL, where light is coming out of the bottom, but could be designed so that light comes out of the top.

FIG. 20 is an exemplary schematic of the side view of a vertical cavity surface emitting laser VCSEL 2001. A substrate 2006 may have deposited layers of P-type distributed Bragg reflector material P$^+$ DBR 2003, and N-type distributed Bragg reflector material N$^+$ DBR 2005. An active region 2004 is inserted in the optical confinement layer 2009 then sandwiched between the P$^+$ DBR 2003 and the N$^+$ DBR 2005 structures. The top metal & aperture 2002 and bottom metal 2007 contacts are provided for applying a bias to the laser. The P-type DBRs 2003 and N-type DBRs 2005 form the resonant optical cavity. The order of the layers is not restricted as described above. Upon application of a current bias to the laser, light out 2008 may be typically emitted from the surface of the laser, which can be the bottom or the top of the laser.

Figure 21:
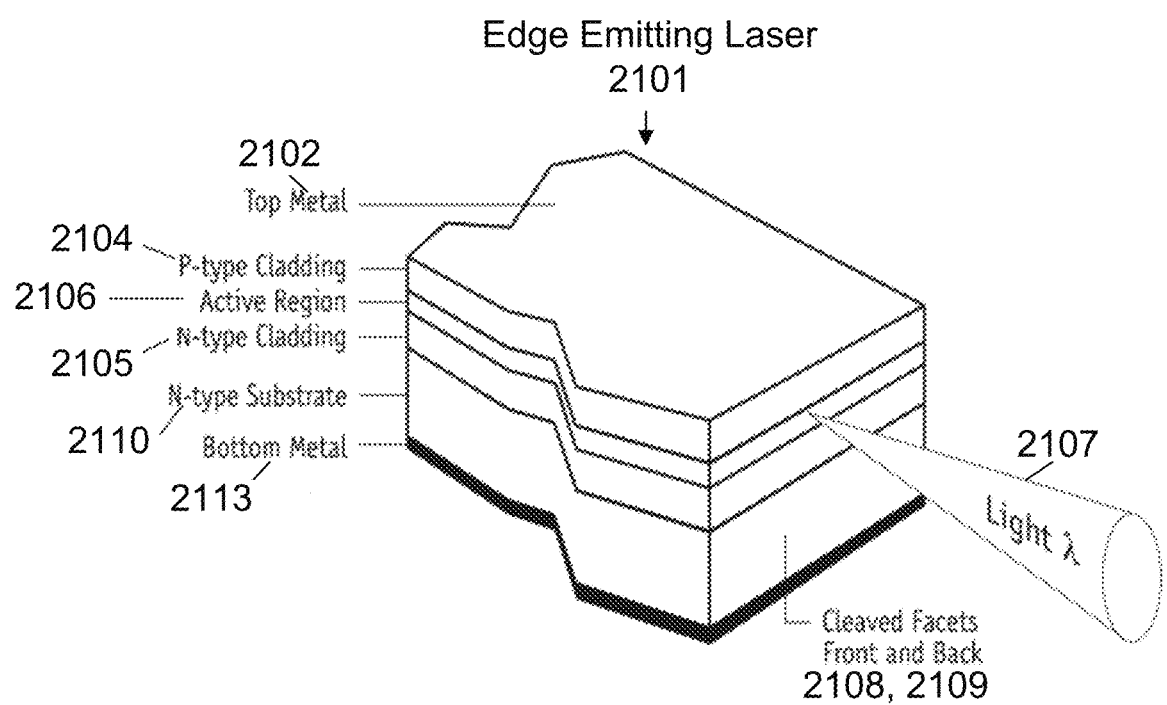
FIG. 21 shows an example of a cut away device depiction of an edge emitting injection diode laser.

Devices such as edge emitting lasers could be integrated in the open field. This methodology would allow the integration of diverse devices from electronic to photonic applications. FIG. 21 shows a perspective schematic of a typical edge emitting injection diode laser or in-plane semiconductor laser 2101. The edge emitting laser 2101 can comprise a substrate 2110 with an active region 2106 disposed between a P-type cladding layer 2104 and an N-type cladding layer 2105. Cleaved facets on the front 2108 and on the back 2109 of the laser typically form a resonant optical cavity. The order of the layers may not be restricted as described above. To activate the laser, a bias current can be applied to the top metal 2102 and bottom metal 2113 contacts. Upon application of the bias to the laser, light of a wavelength λ 2107 is typically emitted from the edge of the laser.

Figure 22:
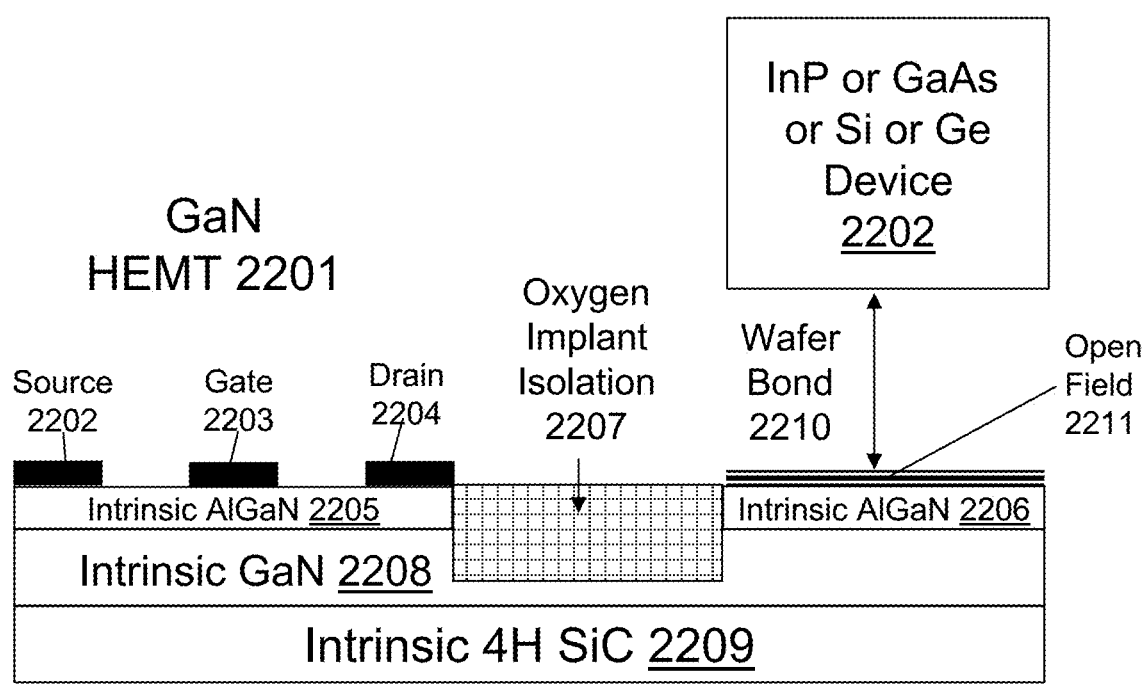
FIG. 22 shows an exemplary cross-sectional view of the monolithic integrated circuit, where a GaN HEMT may be used as a template for integrating additional InP or GaAs or Si device wafer bonded to the GaN HEMT.

The use of a GaN device with an open field for use as a template substrate for other electronic and photonic devices to create multi-functional integrated circuits can be described in the following embodiment. This embodiment represents a possible way of integrating an InP or GaAs or Si or InAs or Ge device to the normally-on GaN HEMT using the GaN HEMT as a template substrate providing for mechanical and thermal advantages. Here an exemplary InP or GaAs or Si or InAs or Ge device may be wafer bonded to the intrinsic channel of the GaN HEMT for monolithic microelectronic integrated circuits. FIG. 22 shows an exemplary cross-sectional view of the monolithic integrated circuit, where a normally-off GaN HEMT 2201, which consists of an intrinsic AlGaN 2205 barrier, on an intrinsic GaN 2208 channel grown on an intrinsic 4H SiC 2209 substrate. Other polymorphs of SiC or GaN or Si or Sapphire or Diamond or GaAs substrates could be also used. The GaN HEMT 2201 consists of a source 2202 metal, gate 2203 metal, and a drain 2204 metal contacts on the intrinsic AlGaN 2205 barrier layer. In the open field 2211 area, an InP or GaAs or Si or Ge device 2202 can be attached to the AlGaN 2206 layer by a wafer bond 2210. Oxygen implant isolation 2207 may be used to isolate the additional InP or GaAs or Si or Ge device 2202. The monolithic wafer bonded GaN HEMT 2201 and the InP or GaAs or Si or Ge device 2202 forms a multi-functional integrated circuit that may be used for electronic or photonic purposes. The InP or GaAs or Si device can be an electronic device or photonic device or solar cell device or thermoelectric device. In a further variation, the AlGaN 2206 layer can be etched away exposing the GaN 2208 layer and the exemplary InP or GaAs or Si device can be wafer bonded to the open field of intrinsic GaN 2208 channel for the formation of monolithic integrated circuits. Note the wafer bonded interface may have additional growth layers like AlGaN alloy or InGaN alloy or InAlN alloy or thin InN or others, etc. (typically less than 200 Å), to promote adhesion and enhance electrical properties. Also the InP or GaAs or Si device 2202 may be backed with thin GaAs or AlAs or InGaAs or Ge or GeSn or SiGe or others, etc., to promote adhesion and enhance electrical properties.

The two major properties of semiconductor materials that must be managed to form an ideal p-n heterojunction are the bandgap energy and the band alignment forming the heterojunction. The conduction and valence band alignments between semiconductors are very important. In the high performance and quality of the heterojunction properties, both the bandgap energy and the band alignment may be chosen for facilitating carrier transport across the junction.

The two major properties of semiconductor materials that must be managed to form an ideal p-n heterojunction are the bandgap energy and the band alignment forming the heterojunction. The conduction and valence band alignments between semiconductors are very important. In the high performance and quality of the heterojunction properties, both the bandgap energy and the band alignment may be chosen for facilitating carrier transport across the junction.

Another embodiment represents a possible way of integrating an InGaP emitter (lattice matched or near latticed matched to GaAs)—GaAs base stack to the normally-off InAlN—GaN HEMT in a vertical configuration using the GaN HEMT as a template substrate providing for mechanical, thermal and electrical advantages. The InGaP—GaAs stack wafer bonded to the GaN intrinsic layer makes for an ideal heterojunction bipolar transistor. The InGaP—GaAs—GaN stack (InGaP—GaAs is standard for HBT industry), may have a near-zero conduction (less than 0.1 eV) band offset throughout the layers from emitter to base to collector, which may be ideal for electron transport in an NPN heterojunction bipolar transistor.

Figure 23:
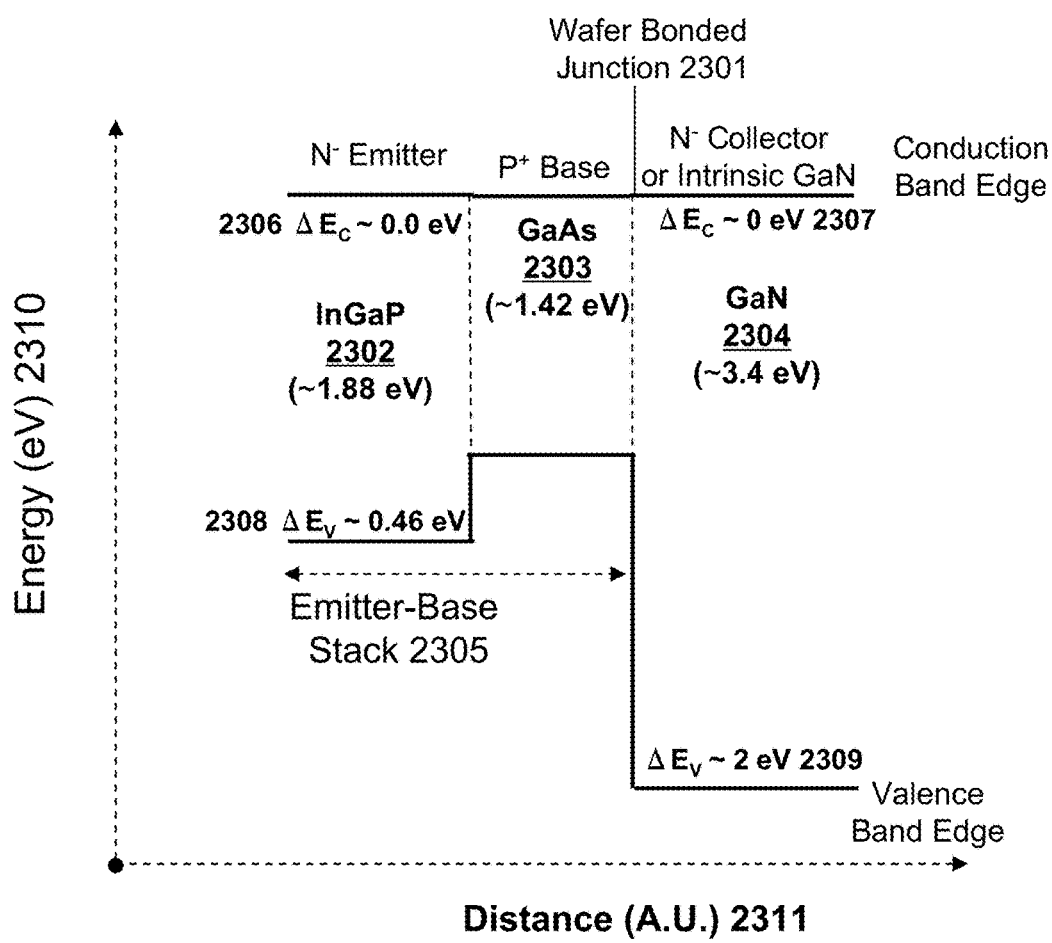
FIG. 23 shows an exemplary flat band energy band diagram of an NPN InGaP emitter-GaAs base-GaN collector HBT.

FIG. 23 shows the exemplary flat band energy band diagram showing the energy band alignments of NPN InGaP Emitter-GaAs Base-GaN Collector HBT 2300, where the vertical axis is Energy (eV) 2310 and the horizontal is the Distance (A.U.) 2311. The approximate bandgap energies are shown in parenthesis for the corresponding material. This device structure may have a near-zero conduction band offsets between emitter-base-collector interfaces and a large valence band offset at the emitter-base and base collector heterojunction. Electrons can be easily injected from the InGaP 2302 emitter through the GaAs 2303 base to the GaN 2304 collector. Conduction band offsets at emitter-base and base-collector junctions are near-zero, with large valence band offsets between the InGaP—GaAs ($\Delta E_V$ 2308) and GaAs—GaN ($\Delta E_V$ 2309) heterojunctions. The band alignments are desirable for high performance NPN HBTs. An emitter-base stack 2305 comprising N$^-$ emitter InGaP 2302 on P$^+$ Base GaAs 2303 structure can be wafer bonded to the GaN 2304 collector. The InGaP 2302 should have a small conduction band offset $\Delta E_C$ 2307 with the GaAs 2303. This emitter-base stack 2305 may be wafer bonded to the N$^-$ collector GaN 2304 thus forming a wafer bonded junction 2301 at the base-collector interface. The GaN 2304 may have a small conduction band offset $\Delta E_C$ 2308 with the GaAs 2303. Note the conduction band offset $\Delta E_C$ is approximately near-zero through the NPN HBT structure.

InGaP semiconductor can be grown epitaxially and latticed matched to GaAs at the approximate composition $In_{0.49}Ga_{0.51}P$. If typically grown at high temperatures, it can grow in an ordered phase where the crystalline structure forms sheets of In—P and Ga—P atoms can alternate in the (001) planes of the face centered cubic (FCC) unit cell without the intermixing of the Ga and In atoms on the lattice planes. The ordered InGaP results in an almost zero conduction band discontinuity between the InGaP and GaAs and is called the ordered phase (this can be of weakly type I or weakly type II because it is close to zero) which may be approximately 0.03 eV for the ordered phase. With different growth conditions, the In and Ga atoms can intermix and the disordered InGaP phase can form, which has an approximate conduction band offset 0.1 eV. In either case the conduction band offset of InGaP to GaAs may be small.

The exemplary structure is shown in Table 11 of the wafer bonded GaAs—GaN HBT.

TABLE 11

Exemplary Structure of Wafer Bonded NPN InGaP—GaAs—GaN HBT.

| Layer | Layer Name | Description | Comment |
|---|---|---|---|
| 1 | N$^+$ Cap | ~1000 Å InGaAs (Te-doped > $10^{19}$ cm$^{-3}$) | |
| 2 | N$^-$ Emitter Cap | ~1500 Å GaAs (Si-doped~5 × $10^{18}$ cm$^{-3}$) | |
| 3 | N$^-$ Emitter | ~500 Å InGaP (Si-doped~3 × $10^{17}$ cm$^{-3}$) | Ordered or disordered or mixed. |
| 4 | P$^+$ Base | ~1000 Å GaAs Thickness range 100 Å-5000 Å | |
| 5 | N$^-$ Collector | ~10000 Å GaN (Si-doped~1 × $10^{16}$ cm$^{-3}$) | Wafer bonded to above. |
| 6 | N$^+$ Sub-Collector | ~5000 Å GaN (Si-doped~5 × $10^{18}$ cm$^{-3}$) | |
| 7 | Substrate | 4 H SiC substrate | Crystalline |

The substrate may be other SiC Polymorphs or other substrates such as GaN or Si or Sapphire or Diamond or GaAs.

Note:
the structure, materials, compositions, thicknesses, dopants, and doping levels are exemplary and does not preclude other possible structures, materials, compositions, combinations or values.

Figure 24:
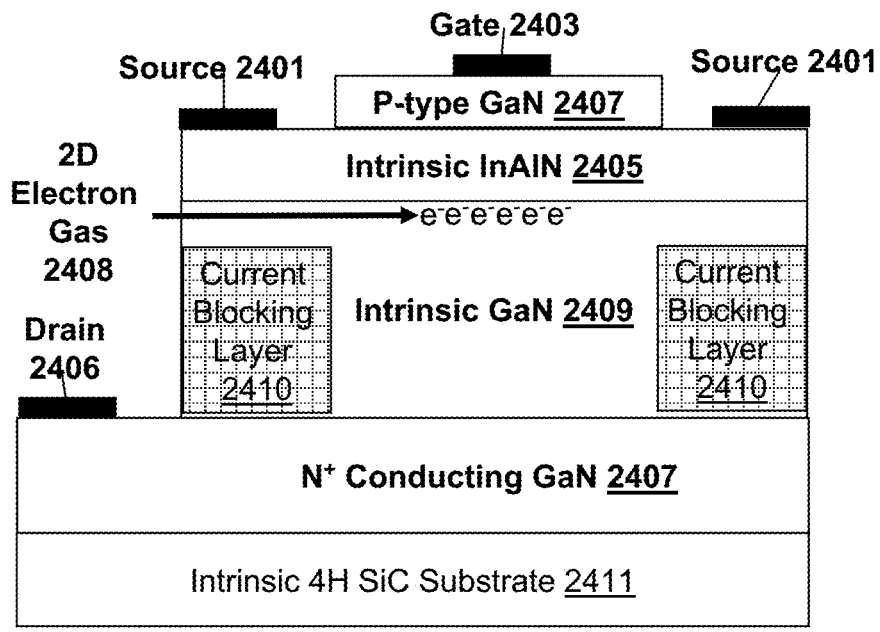
FIG. 24 shows the two types of exemplary devices an InAlN—GaN HEMT and an InGaP—GaAs—GaN NPN HBT that can be integrated monolithically by wafer bonding.
Figure 24:
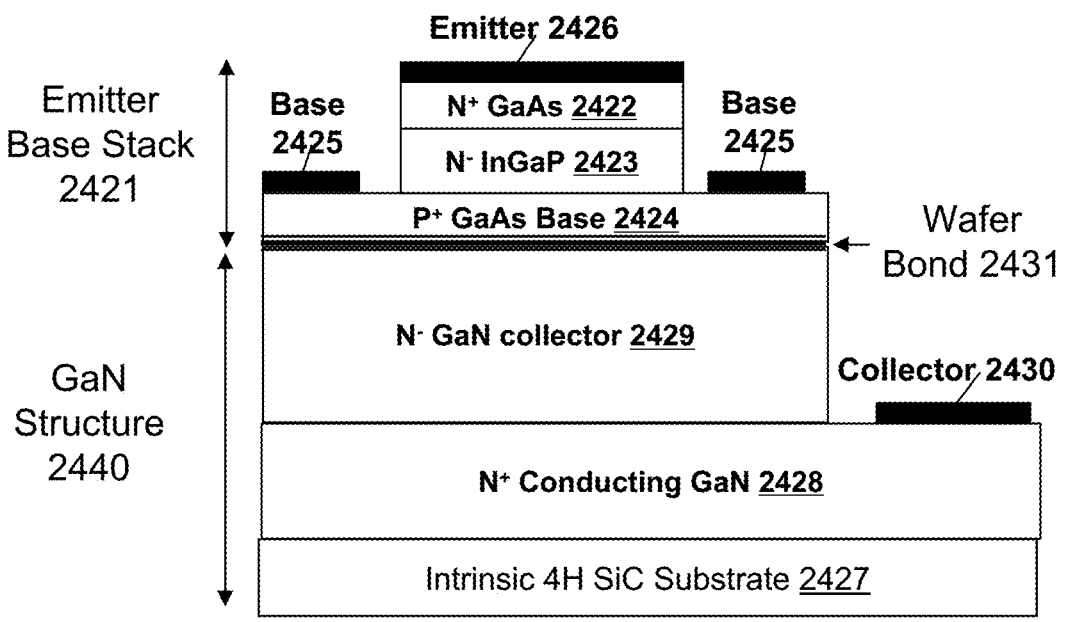

A possible embodiment for integrating an InGaP emitter (lattice matched or near latticed matched to GaAs)—GaAs base stack to the normally-off InAlN—GaN HEMT in vertical configuration may be to use the GaN HEMT as a template substrate providing for mechanical, thermal and electrical advantages. The InGaP—GaAs emitter base stack wafer bonded to the GaN intrinsic layer makes for an ideal heterojunction bipolar transistor based on the flat band energy diagram. The InGaP—GaAs—GaN may have a near-zero conduction band offset (less than 0.1 eV) throughout the layers, which is ideal for an NPN bipolar transistor. FIG. 24 shows the two types of devices a normally-off vertical InAlN—GaN HEMT 2400 and a wafer bonded InGaP—GaAs—GaN NPN HBT 2420 that can be integrated monolithically. An exemplary configuration the InAlN—GaN HEMT 2400 in a vertical configuration, can be used for high power applications. The gate 2403 metal on top P-type GaN 2407 (may be also P-type AlGaN) forms a P-N junction to the intrinsic InAlN 2405, and the source 2401 metal form ohmic contacts to the intrinsic InAlN 2405, and the drain 2406 metal forms an ohmic contact to the N$^+$ Conducting GaN 2407. A 2D electron gas 2408 forms at the intrinsic InAlN 2405 barrier and the intrinsic GaN 2409 channel. There are current blocking layer 2410 which may be boron implants or other P-type dopants or implants that disorder the lattice and make it high resistivity. The current blocking layer 2410 may confine the current in a vertical direction. The structure can be grown on SiC or Si or sapphire or diamond substrate 2411. If the SiC or Si or GaN or diamond is conducting the drain 2406 can be contacted to the bottom of the substrate for a full vertical device. The second device shows another possible exemplary cross-section device depiction of the wafer bonded InGaP—GaAs—GaN NPN HBT 2420 in a mesa configuration. Note that this is a vertical device, which is desirable for power applications because the lateral area can be minimized. The NPN HBT comprises an emitter base stack 2421 with a wafer bond 2431 to the GaN structure 2440 to form the monolithic device. The emitter base stack 2421 consists of a N$^+$ GaAs 2422 on top of N$^-$ InGaP 2423 emitter, followed by a P$^+$ GaAs base 2424. The emitter 2426 metal makes ohmic contact with the N$^+$ GaAs 2422 layer. The base 2425 metal makes ohmic contact to the P$^+$ GaAs Base 2424. The GaN structure 2440 can comprise a variety of forms, but for an exemplary case the GaN is grown on a 4 H SiC substrate 2427, though a GaN or Sapphire or Si or GaAs or diamond substrate could also be used. Starting with an intrinsic 4H SiC substrate 2427 then a N$^+$ Conducting GaN 2428 layer is grown to which a N$^-$ GaN collector 2429 is grown. The collector 2430 metal makes ohmic contact with N$^+$ Conducting GaN 2428. This finalizes the GaN structure 2440.

Figure 25:
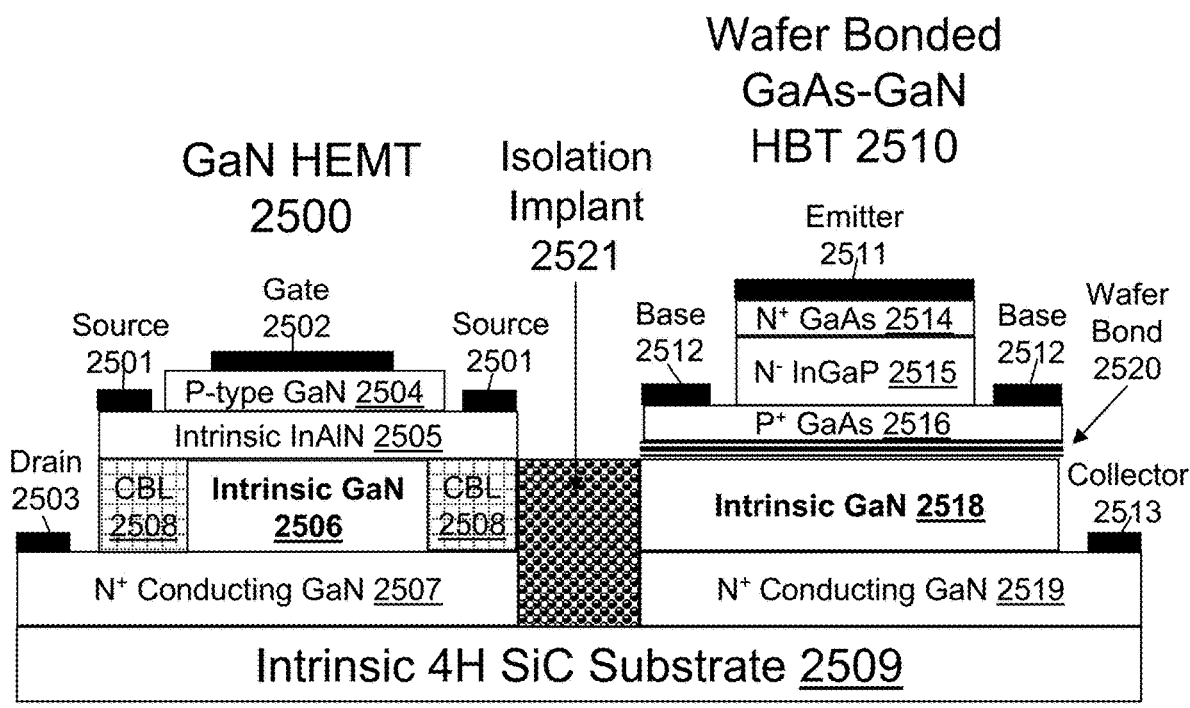
FIG. 25 shows an exemplary cross-sectional view of the monolithic integrated circuit combining a GaN HEMT and a wafer bonded GaAs—GaN HBT.

To monolithically integrate both devices one possible exemplary strategy is shown in FIG. 25. The use of a GaN device with the an open field for use as a template substrate for other electronic and photonic devices to create multi-functional integrated circuits can be described in the following embodiment. FIG. 25 shows an exemplary cross-sectional view of the monolithic integrated circuit combining a GaN HEMT 2500 and a wafer bonded GaAs—GaN HBT 2510. The normally-off GaN HEMT 2500 has the gate 2502 metal on top of the P-type GaN 2504 (also P-type AlGaN or P-type InAlN may be used) forms a P-N junction to the intrinsic InAlN 2505, and the source 2501 metal forms ohmic contacts to the intrinsic InAlN 2505, and the drain 2503 metal forms an ohmic contact to the N$^+$ conducting GaN 2507. A 2D electron gas may form at the intrinsic InAlN 2505 and the intrinsic GaN 2506. There may be CBL 2508 (current blocking layer) which may be boron implants or other P-type dopants or implants that disorder the lattice and make it high resistivity. The CBL 2508 (current blocking layer) may confine the current in a vertical direction. The structure can be grown on SiC substrate 2509 or Si or Sapphire or Diamond substrate. After fabrication of the GaN HEMT an isolation Implant 2521 may be required for isolation. To add the emitter-base stack 2530 to be wafer bonded to the GaN HEMT 2500, an open field area may be produced by photolithography where the P-type GaN 2504 and the intrinsic InAlN 2505 may be etched away by etching processes. This may make an open field where the intrinsic GaN 2518 is exposed. In this area the emitter-base stack 2530 may be wafer bonded 2520 to the Intrinsic GaN 2518 by the P$^+$ GaAs 2516 layer. After wafer bonding the standard device processing may be used to fabricate the device. Additionally one may utilize epitaxial lift-off to create the device structure. The wafer bonded GaAs—GaN HBT 2510 consists of an emitter 2511 metal which makes ohmic contact to the N$^+$ GaAs 2514, which may be on top of the N$^-$ InGaP 2515 emitter, which is on top of the P$^+$ GaAs 2516 base which may be wafer bonded to the intrinsic GaN 2518 layer, which acts as the collector for the HBT. The base 2512 metal makes ohmic contact to the P$^+$ GaAs 2516 base. The collector 2513 metal contacts the N$^+$ conducting GaN 2519 which finalizes the device. FIG. 25 demonstrates an exemplary methodology where GaN HEMT not only provides for a device but acts as double duty by providing a intrinsic GaN 2518 which may be used as the collector for a GaAs HBT. Note the wafer bonded interface may have additional growth layers like AlGaN alloy or InGaN alloy or InAlN alloy or thin InN or others, etc. (typically less than 200 Å), to promote adhesion and enhance electrical properties. Also the InP or GaAs or Si device may be backed with thin GaAs or AlAs or InGaAs or Ge or GeSn or SiGe or others, etc., to promote adhesion and enhance electrical properties.

Another embodiment represents a possible way of integrating an InP emitter (lattice matched or near latticed matched to GaAsSb)—GaAsSb base stack to the normally-off InAlN—GaN HEMT in a vertical configuration using the GaN HEMT as a template substrate providing for mechanical, thermal and electrical advantage. The InP—GaAsSb stack wafer bonded to the GaN intrinsic layer makes for an ideal heterojunction bipolar transistor. The InP—GaAsSb—GaN stack may have a near-zero conduction (less than 0.15 eV) band offset throughout the layers from emitter to base to collector, which may be ideal for electron transport in an NPN heterojunction bipolar transistor. GaAsSb may be lattice matched to InP at the following approximate composition $GaAs_{0.5}Sb_{0.5}$.

Figure 26:
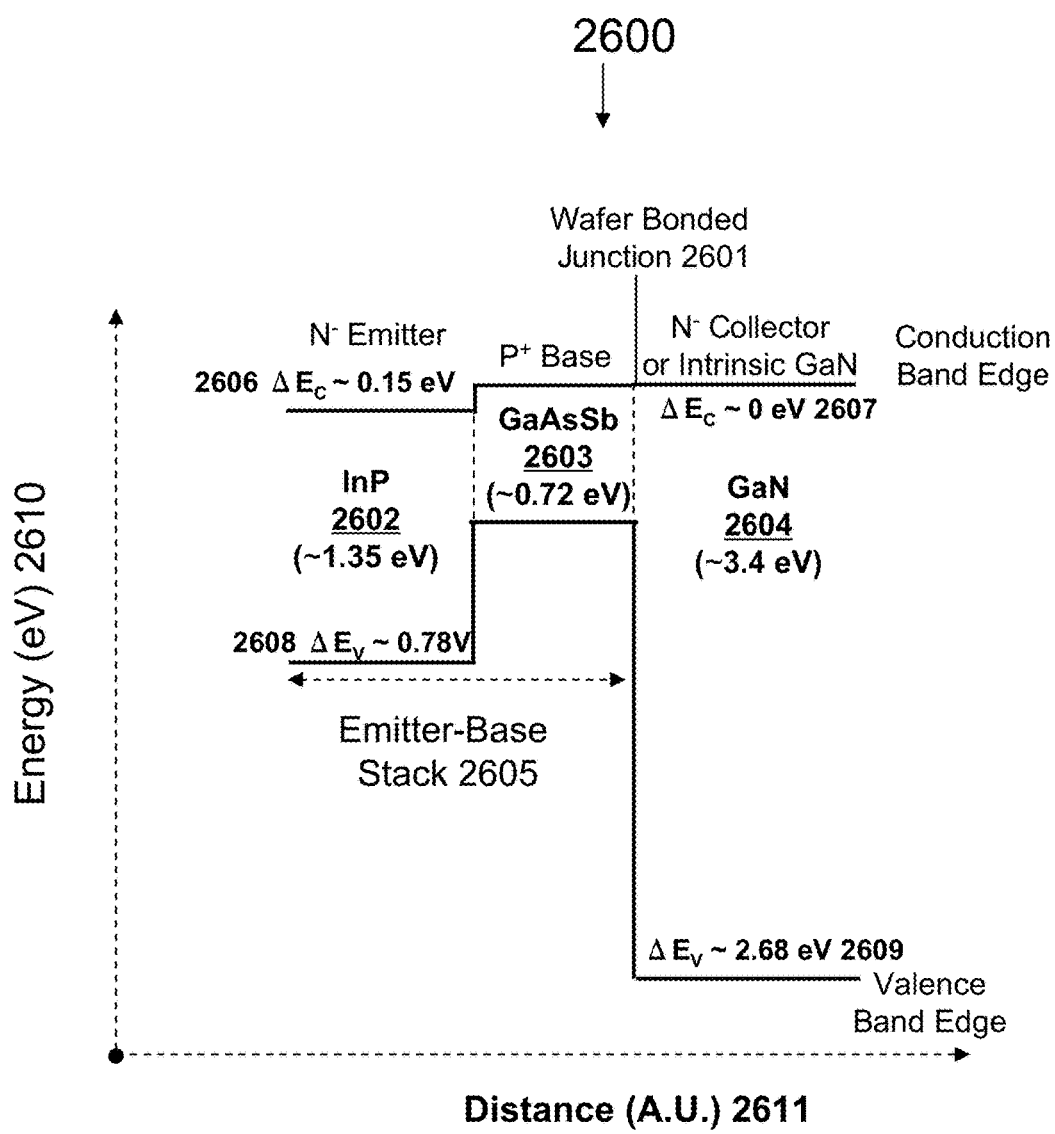
FIG. 26 shows the exemplary flat band energy band diagram showing the energy band alignments of NPN InP Emitter-GaAsSb Base-GaN Collector HBT.

FIG. 26 shows the exemplary flat band energy band diagram showing the energy band alignments of NPN InP Emitter-GaAsSb Base-GaN Collector HBT 2600, where the vertical axis is Energy (eV) 2610 and the horizontal is the Distance (A.U.) 2611. The approximate bandgap energies are shown in parenthesis for the corresponding material. This device structure may have a low conduction band offsets (<0.15 eV) between emitter-base-collector interfaces and a large valence band offset at the emitter-base and base collector heterojunction. Electrons can be easily injected from the InP 2602 emitter through the GaAsSb 2603 base to the GaN 2604 collector. Conduction band offsets at emitter-base and base-collector junctions may be about 0.15 eV, with large valence band offsets between the InP—GaAs ($\Delta E_V$ 2608) and GaAs—GaN ($\Delta E_V$ 2609) heterojunctions. The band alignments are desirable for high performance NPN HBTs. An emitter-base stack 2605 comprising N$^-$ emitter InP 2602 on P+ Base GaAsSb 2603 structure can be wafer bonded to the GaN 2604 collector. The InP 2602 should have a small conduction band offset $\Delta E_C$ 2607 with the GaAsSb 2603. This emitter-base stack 2605 may be wafer bonded to the N− collector GaN 2604 thus forming a wafer bonded junction 2601 at the base-collector interface. The GaN 2604 may have a small conduction band offset $\Delta E_C$ 2607 with the GaAsSb 2603. Note the conduction band offset $\Delta E_C$ is approximately small through the NPN HBT structure.

The exemplary structure is shown in Table 12 of the wafer bonded InP—GaN HBT.

TABLE 12

Exemplary Structure of Wafer Bonded NPN InP—GaAsSb—GaN HBT.

| Layer | Layer Name | Description | Comment |
|---|---|---|---|
| 1 | N+ Cap | ~500 Å $In_{0.53}Ga_{0.47}As$ (Te-doped > $10^{19}$ $cm^{-3}$) | |
| 2 | N− Emitter Cap | ~500 Å InP (Te-doped~1× $10^{19}$ $cm^{-3}$) | |
| 3 | N− Emitter | ~700 Å InP (Si-doped~3 × $10^{17}$ $cm^{-3}$) | |
| 4 | P+ Base | ~700 Å $GaAs_{0.5}Sb_{0.5}$~5 × $10^{19}$ $cm^{-3}$) Thickness range 100 Å-5000 Å | |
| 5 | N− Collector | ~5000 Å GaN (Si-doped~1 × $10^{18}$ $cm^{-3}$) | Wafer bonded to above. |
| 6 | N+ Sub-Collector | ~5000 Å GaN (Si-doped~5 × $10^{18}$ $cm^{-3}$) | |
| 7 | Substrate | N+ GaN substrate | Crystalline |

The substrate may be other SiC Polymorphs or other substrates such as GaN or Si or Sapphire or Diamond or GaAs.
The emitter could also utilize a latticed matched $In_{0.52}Al_{0.48}As$ to InP with a bandgap energy of 1.46 eV.
Note:
the structure, materials, compositions, thicknesses, dopants, and doping levels are exemplary and does not preclude other possible structures, materials, compositions, combinations or values.

This structure could also be modified by the inclusion of InAlAs latticed matched to InP emitter where the band alignment of InAlAs to GaAsSb may be of a type I heterojunction. $In_{0.52}Al_{0.48}As$ conduction band offset $\Delta E_C$ with $GaAs_{0.5}Sb_{0.5}$ may be approximately 0.1 eV, and the valence band offset $\Delta E_V$ may be about 0.64 eV. Making InAlAs also a possible emitter material.

This embodiment represents a possible way of integrating an InP emitter- GaAsSb base (lattice matched or near lattice matched to InP) stack to the normally-off InAlN—GaN HEMT in vertical configuration using the GaN HEMT as a template substrate providing for mechanical, thermal and electrical advantages. The InP—GaAsSb stack wafer bonded to the GaN intrinsic layer makes for an ideal heterojunction bipolar transistor based on the flat band energy diagram. The InP—GaAsSb has a small type II band offset, but the GaAsSb to GaN may have a near-zero conduction (less than 0.1 eV) band offset.

Figure 27:
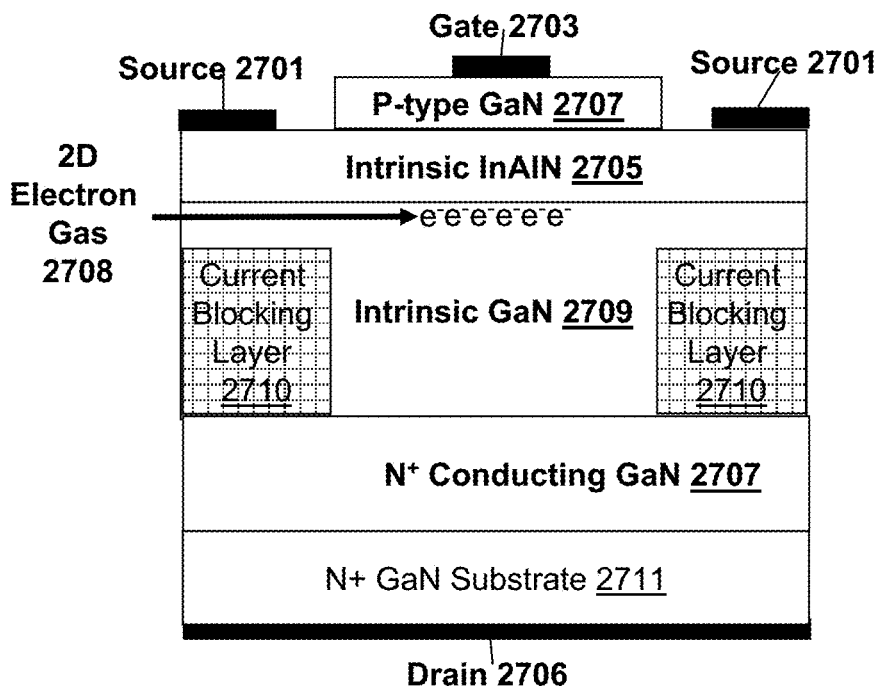
FIG. 27 shows the two types of exemplary devices a normally-off vertical InAlN—GaN HEMT and a wafer bonded InP—GaAsSb—GaN NPN HBT that can be integrated monolithically.
Figure 27:
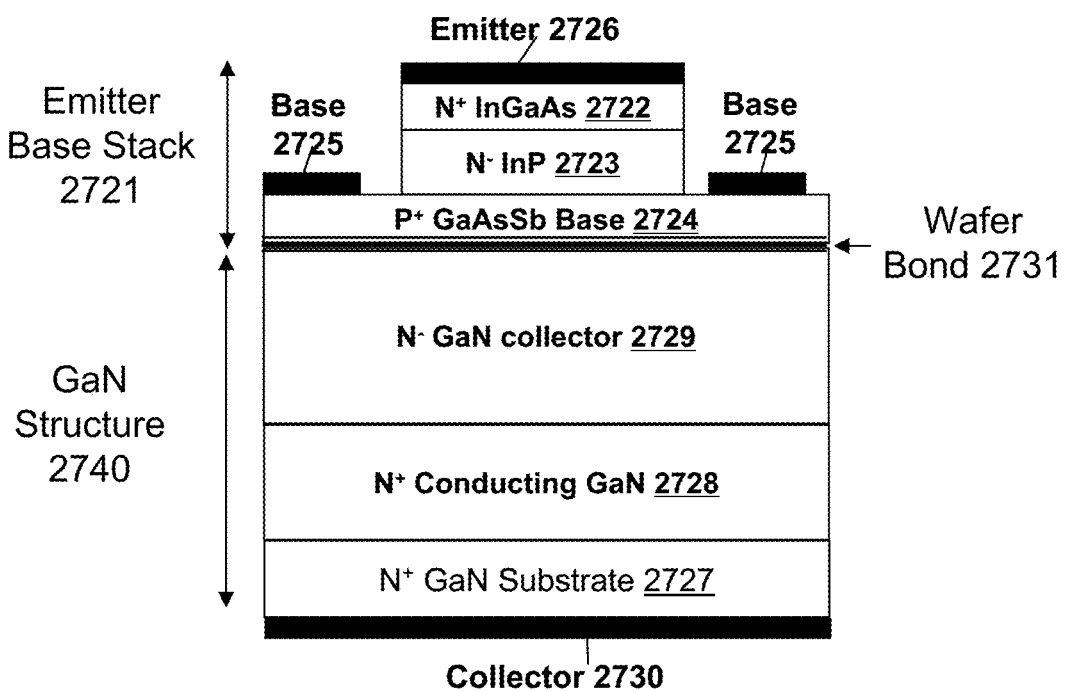

A possible embodiment for integrating an InP emitter (lattice matched or near latticed matched to GaAsSb)—GaAsSb base stack to the normally-off InAlN—GaN HEMT in vertical configuration may be to use the GaN HEMT as a template substrate providing for mechanical, thermal and electrical advantages. The InP—GaAsSb emitter base stack wafer bonded to the GaN intrinsic layer makes for an ideal heterojunction bipolar transistor based on the flat band energy diagram. The InP—GaAsSb—GaN may have a conduction band offset (less than 0.15 eV) throughout the layers, which may be ideal for an NPN bipolar transistor. FIG. 27 shows the two types of devices, a normally-off vertical InAlN—GaN HEMT 2700 and a wafer bonded InP—GaAsSb—GaN NPN HBT 2720 that can be integrated monolithically. An exemplary configuration of the InAlN—GaN HEMT 2700 in a vertical configuration, can be used for high power applications. The gate 2703 metal on top P-type GaN 2707 (may be also P-type AlGaN) forms a P-N junction to the intrinsic InAlN 2705, and the source 2701 metal forms ohmic contacts to the intrinsic InAlN 2705, and the drain 2706 metal forms an ohmic contact to the N+ Conducting GaN 2707. A 2D electron gas 2708 forms at the intrinsic InAlN 2705 barrier and the intrinsic GaN 2709 channel. There are current blocking layer 2710 which may be boron implants or other P-type dopants or implants that disorder the lattice and make it high resistivity. The current blocking layer 2710 may confine the current in a vertical direction. The structure can be grown on a N+ GaN substrate 2711. The drain 2706 can be contacted to the bottom of the substrate for a full vertical device. The second device shows another possible exemplary cross-section device depiction of the wafer bonded InP—GaAsSb—GaN NPN HBT 2720 in a mesa configuration. Note that this is a true vertical device, which is desirable for power applications because the lateral area can be minimized. The NPN HBT comprises an emitter base stack 2721 with a wafer bond 2731 to the GaN structure 2740 to form the monolithic device. The emitter base stack 2721 consists of a N+ InGaAs 2722 on top of N−InP 2723 emitter, followed by a P+ GaAsSb base 2724. The emitter 2726 metal makes ohmic contact with the N+ InGaAs 2722 layer. The base 2725 metal makes ohmic contact to the P+ GaAsSb Base 2724. The GaN structure 2740 consists of starting with an N+ GaN substrate 2727 then a N+ Conducting GaN 2728 layer may be grown to which a N− GaN collector 2729 may be grown. The collector 2730 metal makes ohmic contact with back side of the N+ GaN substrate 2727. This finalizes the GaN structure 2740.

Figure 28:
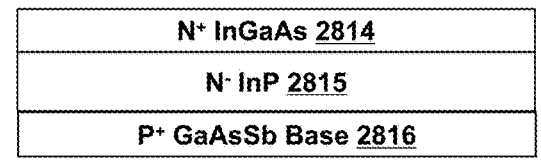
FIG. 28 shows an exemplary cross-sectional view of the monolithic integrated circuit combining a GaN HEMT and a wafer bonded GaAsSb—GaN HBT.
Figure 28:
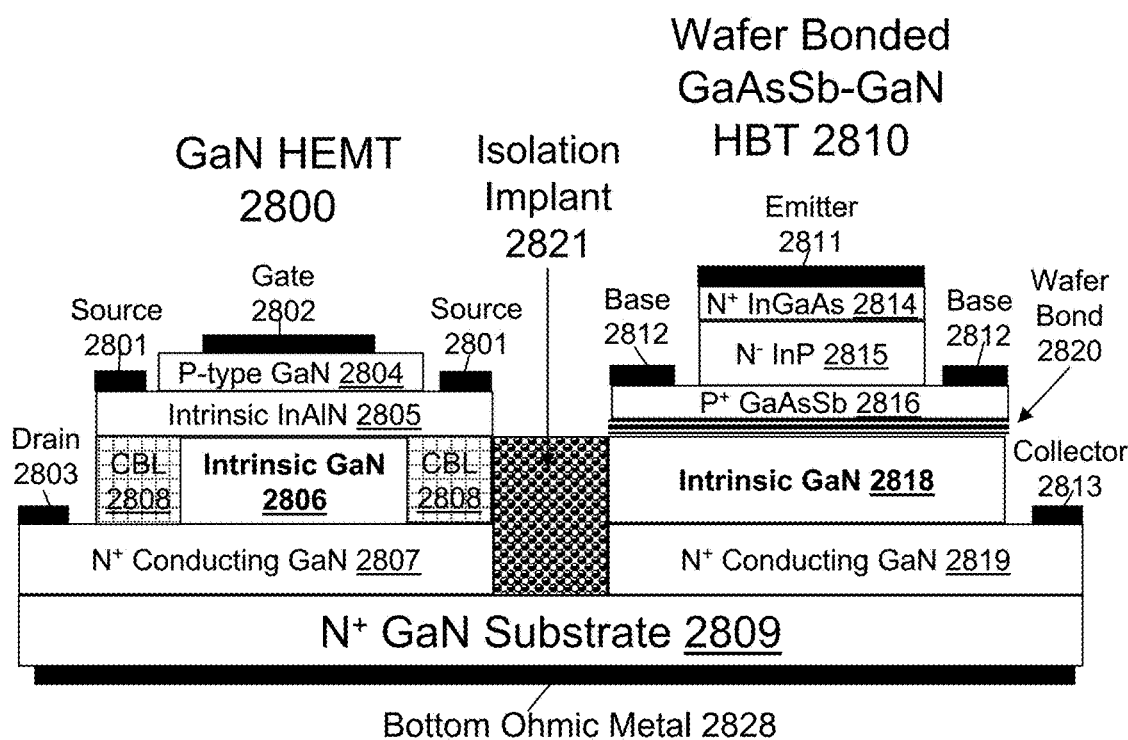

To monolithically integrate both devices one possible exemplary strategy may be shown in FIG. 28. The use of a GaN device with the an open field for as use as a template substrate for other electronic and photonic devices to create multi-functional integrated circuits can be described in the following embodiment. FIG. 28 shows an exemplary cross-sectional view of the monolithic integrated circuit combining a GaN HEMT 2800 and a wafer bonded GaAsSb—GaN HBT 2810. The normally-off GaN HEMT 2800 has the gate 2802 metal on top of the P-type GaN 2804 (also P-type AlGaN or P-type InAlN may be used) forms a P-N junction to the intrinsic InAlN 2805, and the source 2801 metal forms ohmic contacts to the intrinsic InAlN 2805, and the drain 2803 metal forms an ohmic contact to the N+ conducting GaN 2807. A 2D electron gas may form at the intrinsic InAlN 2805 and the intrinsic GaN 2806. There may be CBL 2808 (current blocking layer) which may be boron implants or other P-type dopants or implants that disorder the lattice and make it high resistivity. The CBL 2808 (current blocking layer) may confine the current in a vertical direction. The structure can be grown on N+ GaN substrate 2809. After fabrication of the GaN HEMT 2800, an isolation Implant 2821 may be required for isolation. To add the emitter-base stack 2830 to be wafer bonded to the GaN HEMT 2800, an open field area may be produced by photolithography where the P-type GaN 2804 and the intrinsic InAlN 2805 may be etched away by etching processes. This may make an open field where the intrinsic GaN 2818 is exposed. In this area the emitter-base stack 2830 may be wafer bonded 2820 to the intrinsic GaN 2818 by the P$^+$ GaAsSb base 2816 layer. After wafer bonding the standard device processing may be used to fabricate the device. Additionally one may utilize epitaxial lift-off to create the device structure. The wafer bonded GaAsSb—GaN HBT 2810 consists of an emitter 2811 metal which makes ohmic contact to the N$^+$ InGaAs 2814, which may be on top of the N$^-$InP 2815 emitter, which is on top of the P$^+$ GaAsSb 2816 base which may be wafer bonded to the intrinsic GaN 2818 layer, which acts as the collector for the HBT. The base 2812 metal makes ohmic contact to the P$^+$ GaAsSb 2816 base. The collector 2813 metal contacts the N$^+$ conducting GaN 2819. A bottom ohmic metal 2828 contact can be a drain contact for the GaN HEMT 2800 or can be used for the wafer bonded GaAsSb—GaN HBT 2810 as the collector contact. FIG. 28 demonstrates an exemplary methodology where GaN HEMT not only provides for a device but acts as double duty by providing a intrinsic GaN 2818 which may be used as the collector for an InP—GaAsSb HBT. Note the wafer bonded interface may have additional growth layers like AlGaN alloy or InGaN alloy or InAlN alloy or thin InN or others, etc. (typically less than 200 Å), to promote adhesion and enhance electrical properties. Also the InP or GaAs or Si device may be backed with thin GaAs or AlAs or InGaAs or Ge or GeSn or SiGe or others, etc., to promote adhesion and enhance electrical properties.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Furthermore, the terms "include," and "have," and any variations thereof, are intended to cover a non-exclusive inclusion, such that a process, method, system, article, device, or apparatus that comprises a list of elements is not necessarily limited to those elements, but may include other elements not expressly listed or inherent to such process, method, system, article, device, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein.

The terms "couple," "coupled," "couples," "coupling," and the like should be broadly understood and refer to connecting two or more elements or signals, electrically, mechanically and/or otherwise. Two or more electrical elements may be electrically coupled but not be mechanically or otherwise coupled; two or more mechanical elements may be mechanically coupled, but not be electrically or otherwise coupled; two or more electrical elements may be mechanically coupled, but not be electrically or otherwise coupled. Coupling may be for any length of time, e.g., permanent or semi permanent or only for an instant.

"Electrical coupling" and the like should be broadly understood and include coupling involving any electrical signal, whether a power signal, a data signal, and/or other types or combinations of electrical signals. "Mechanical coupling" and the like should be broadly understood and include mechanical coupling of all types.

The absence of the word "removably," "removable," and the like near the word "coupled," and the like does not mean that the coupling, etc. in question is or is not removable. For example, the recitation of a casing being coupled to an armband does not mean that the casing cannot be removed (readily or otherwise) from, or that it is permanently connected to, the armband.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the methods, processes, and activities described herein may be comprised of many different activities, procedures and be performed by many different modules, in many different orders that any element of the figures may be modified and that the foregoing discussion of certain of these embodiments does not necessarily represent a complete description of all possible embodiments.

All elements claimed in any particular claim are essential to the embodiment claimed in that particular claim. Consequently, replacement of one or more claimed elements constitutes reconstruction and not repair. Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims, unless such benefits, advantages, solutions, or elements are stated in such claim.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The invention claimed is:
1. A heterojunction bipolar transistor comprising:
an N-type InGaP emitter;
a P-type GaAs base;
an N-type GaN collector;

an emitter-base junction between the N-type InGaP emitter and the P-type GaAs base, and comprising a first conduction band offset and a base-collector junction between the P-type GaAs base and the N-type GaN collector, and comprising a second conduction band offset, wherein:
- a growth condition of the N-type InGaP emitter comprises one of: ordered, disordered, or mixed;
- the P-type GaAs base is wafer bonded to the N-type GaN collector;
- the base-collector junction comprises a diode I-V characteristic;
- the first conduction band offset is less than 0.1 eV and adjustable based on the growth condition of the N-type InGaP emitter; and
- the second conduction band offset is less than 0.1 eV.

2. The heterojunction bipolar transistor of claim 1, wherein:
the heterojunction bipolar transistor is a wafer bonded GaAs—GaN heterojunction bipolar transistor.

3. The heterojunction bipolar transistor of claim 1, wherein:
the heterojunction bipolar transistor is a wafer bonded InGaP—GaAs—GaN heterojunction bipolar transistor.

4. The heterojunction bipolar transistor of claim 1, wherein:
the N-type GaN collector is grown on one of: a GaN substrate, a SiC substrate, a Si substrate, a sapphire substrate, or a diamond substrate.

5. The heterojunction bipolar transistor of claim 1, wherein:
when the P-type GaAs base is wafer bonded to the N-type GaN collector, a wafer bonded interface is formed between the P-type GaAs base and the N-type GaN collector.

6. The heterojunction bipolar transistor of claim 5, wherein:
the wafer bonded interface further comprises a layer of at least one of: InAlN or InGaN.

7. The heterojunction bipolar transistor of claim 5, wherein:
the wafer bonded interface further comprises a layer of InN.

8. The heterojunction bipolar transistor of claim 1, wherein:
the N-type InGaP emitter is lattice matched or near lattice matched to the P-type GaAs base.

9. A method of manufacturing a heterojunction bipolar transistor, the method comprising:
forming an N-type InGaP emitter;
forming a P-type GaAs base;
forming an N-type GaN collector;
forming an emitter-base junction between the N-type InGaP emitter and the P-type GaAs base, wherein the emitter-base junction comprises a first conduction band offset and
forming a base-collector junction between the P-type GaAs base and the N-type GaN collector, wherein the base-collector junction comprises a second conduction band offset, wherein:
- a growth condition of the N-type InGaP emitter comprises one of: ordered, disordered, or mixed;
- the P-type GaAs base is wafer bonded to the N-type GaN collector;
- the base-collector junction comprises a diode I-V characteristic;
- the first conduction band offset is less than 0.1 eV and adjustable based on the growth condition of the N-type InGaP emitter; and
- the second conduction band offset is less than 0.1 eV.

10. The method of claim 9, wherein:
the heterojunction bipolar transistor is a wafer bonded GaAs—GaN heterojunction bipolar transistor.

11. The method of claim 9, wherein:
the heterojunction bipolar transistor is an a wafer bonded InGaP—GaAs—GaN heterojunction bipolar transistor.

12. The method of claim 9, wherein:
the N-type GaN collector is grown on one of: a GaN substrate, a SiC substrate, a Si substrate, a sapphire substrate, or a diamond substrate.

13. The method of claim 9, wherein:
when the P-type GaAs base is wafer bonded to the N-type GaN collector, a wafer bonded interface is formed between the P-type GaAs base and the N-type GaN collector.

14. The method of claim 13, wherein:
the wafer bonded interface further comprises a layer of at least one of: InAlN or InGaN.

15. The method of claim 13, wherein:
the wafer bonded interface further comprises a layer of InN.

16. The method of claim 9, wherein:
the N-type InGaP emitter is lattice matched or near lattice matched to the P-type GaAs base.

* * * * *